(12) United States Patent
Takahashi

(10) Patent No.: US 6,607,612 B1
(45) Date of Patent: Aug. 19, 2003

(54) MAGNETIC ALLOY AND MAGNETIC RECORDING MEDIUM AND METHOD FOR PREPARATION THEREOF, AND TARGET FOR FORMING MAGNETIC FILM AND MAGNETIC RECORDING DEVICE

(75) Inventor: Migaku Takahashi, 20-2, Hitokita 2-Chome Taihaku-Ku, Sendai-shi Miyagi-Ken (JP)

(73) Assignees: Migaku Takahashi, Miyagi-ken (JP); Fuji Electric Co., Ltd., Kanagawa-ken (JP); Showa Denko K.K., Tokyo (JP)

( * ) Notice: Subject to any disclaimer, the term of this patent is extended or adjusted under 35 U.S.C. 154(b) by 0 days.

(21) Appl. No.: 09/743,283
(22) PCT Filed: May 12, 2000
(86) PCT No.: PCT/JP00/03062
§ 371 (c)(1),
(2), (4) Date: Jan. 8, 2001
(87) PCT Pub. No.: WO00/70106
PCT Pub. Date: Nov. 23, 2000

(30) Foreign Application Priority Data

May 14, 1999 (JP) ............................................. 11-135038

(51) Int. Cl.[7] ........................... H01F 1/04; C22C 19/07; C25D 5/26; G11B 5/66; G11B 5/70
(52) U.S. Cl. ....................... 148/301; 148/302; 148/313; 148/315; 420/436; 428/611; 428/668; 428/900; 428/694 T
(58) Field of Search ..................... 420/436; 428/694 T, 428/900, 611, 668; 148/302, 313, 301, 315; 360/97.01; 204/192.2; 427/128, 585, 596

(56) References Cited

U.S. PATENT DOCUMENTS

| | | | |
|---|---|---|---|
| 5,069,983 A | 12/1991 | Nakamura et al. | 428/694 |
| 5,557,313 A | 9/1996 | Nakayama et al. | 347/203 |
| 6,324,032 B1 * | 11/2001 | Ohtsuka et al. | 360/131 |
| 6,383,667 B1 * | 5/2002 | Futamoto et al. | 428/694 TS |

FOREIGN PATENT DOCUMENTS

| | | |
|---|---|---|
| JP | 60228637 | 11/1985 |
| JP | 619570 | 1/1986 |
| JP | 62-208413 | 9/1987 |
| JP | 62222437 | 9/1987 |
| JP | 633406 | 1/1988 |
| JP | 6227015 | 8/1994 |
| JP | 790565 | 4/1995 |
| JP | 9147348 | 6/1997 |

OTHER PUBLICATIONS

Naka et al., "Corrosion behavior of amorphous cobalt–base alloys", Rapidly Quenched Met., Proc. Int Conf., 3$^{rd}$, vol. 2, pp. 449–456, 1978.*

N. Naka et al., "Corrosion Behavior of Amorphous Cobalt–Base Alloys," Rapidly Quenched Met., Proc. Int. Conf., 3rd, V. 2, 1978, pp. 449–456, XP–001121283.

* cited by examiner

Primary Examiner—Holly Rickman
(74) Attorney, Agent, or Firm—Young & Thompson

(57) ABSTRACT

The magnetic alloy includes cobalt (Co), chromium (Cr), and germanium (Ge), the composition of the magnetic alloy being represented by the general formula:

$$Co_xCr_yGe_z$$

where x, y and z, which represent the composition ratio in terms of atomic %, satisfy the relationships: $78 \leq x \leq 87$, $2.5 \leq y \leq 14.5$, $3.5 \leq z \leq 15$ and $x+y+z=100$. The magnetic alloy may have a composition represented by the formulas: CoCrGeT (T represents one or more elements of Ta, Si, Nb, B, Ni and Pt) or a composition represented by the formula: CoCrGeT' (T' represents one or more elements of Ta, B, and Pt).

20 Claims, 18 Drawing Sheets ic recording device comprising the magnetic recording medium. The magnetic alloy and magnetic recording medium of the present invention are suited for use as hard disks, floppy disks, and magnetic tapes.

MAGNETIC ALLOY AND MAGNETIC RECORDING MEDIUM AND METHOD FOR PREPARATION THEREOF, AND TARGET FOR FORMING MAGNETIC FILM AND MAGNETIC RECORDING DEVICE

TECHNICAL FIELD

The present invention relates to a magnetic alloy, a magnetic recording medium and a method of producing the same, a target, and a magnetic recording device and, more particularly, to a magnetic alloy which has a high normalized coercive force, suppresses thermal agitation and also has thermally stable magnetic characteristics, a magnetic recording medium and a method of producing the same, a target for forming a magnetic film, and a magnetic recording device comprising the magnetic recording medium. The magnetic alloy and magnetic recording medium of the present invention are suited for use as hard disks, floppy disks, and magnetic tapes.

BACKGROUND ART

Although magnetic recording media have widely been employed as recording media having high density and large capacity in hard disk devices, recently, an improvement of recording/reproduction characteristics has been required to increase the recording density.

FIG. 19 and FIG. 20 are schematic views showing a hard disk as an example of a magnetic recording medium. FIG. 19 is a perspective view showing the whole body of a disk type magnetic recording medium, while FIG. 20 is a cross-sectional view taken along lines A–A' of the magnetic recording medium shown in FIG. 19.

The magnetic recording medium 50 shown in FIG. 19 is composed of a substrate 51 made of a disk type non-magnetic substance, and an underlayer 54, a recording layer 55 and a protective layer 56, which are formed on the substrate 51.

In the magnetic recording medium 50 of this example, for example, a substrate comprising a base 52 made of an Al alloy, and a non-magnetic layer 53 made of Ni—P provided on the surface of the base 52 is used as the substrate 51 made of the non-magnetic substance. As the substrate 51, a base made of glass is sometimes used. On the substrate 51, an underlayer 54 made of Cr, a recording layer 55 made of a magnetic film of CoCrTa or CoCrTaPt, and a protective layer 56 made of C (carbon) are laminated in order. The protective film 56 is sometimes coated with a lubricating film made of a fluororesin such as perfluoropolyether. In the cross-sectional structure shown in FIG. 20, a lubricating film is omitted.

With respect to the magnetic film, which constitutes the recording layer 55 in this kind of magnetic recording medium 50, a magnetic film made of a CoNiCr alloy (having Hc of about 1200 Oe) has been used in first generation magnetic recording media and a magnetic film made of a CoCrTa alloy with a composition which is close to $Co_{84-86}Cr_{10-12}Ta_4$ has been used in second generation magnetic recording media and, furthermore, a magnetic film (having an Hc of about 1800 Oe) made of a CoCrTa alloy with a composition close to $Co_{78-80}Cr_{15-17}Ta_5$ has been used in third generation magnetic recording media and a magnetic film made of a CoCrTaPt alloy with a composition close to $Co_{54-77}Cr_{16-22}Ta_{2-4}Pt_{5-10}$ has been used in fourth generation magnetic recording media.

These changes in generations were caused by the requirements for more excellent magnetic characteristics for the magnetic film to be used in keeping with improvements in the recording density of magnetic recording media, resulted in the development of various materials.

By the way, the present inventors had already learned that, even if a magnetic film made of an alloy having the above magnetic characteristics is formed on a substrate, only a coercive force which is drastically smaller than the coercive force that the film should ideally exhibit, is obtained in the magnetic film. For example, it can be surmised that the coercive force of about 3000 Oe of an isotropic medium can; be exhibited by a CoNiCr alloy and a coercive force of about 2500 Oe can be exhibited by a CoCrTa alloy. However, it is considered that a magnetic films having a coercive force which is far smaller than the above values are sometimes obtained in magnetic films made of these alloy materials obtained by a general film forming process and only a magnetic film having a half or less of the ideal coercive force are obtained in some cases.

Therefore, the present inventors have intensively studied intensively methods of producing magnetic films made of CoCrTa and CoCrTaPt alloys, which are exclusively used at present, in order to cope with the increase of the recording density of magnetic recording media and found a method capable of significantly improving the magnetic characteristics of these magnetic films. They termed this method an ultra clean process and various patent applications were filed (see U.S. Pat. No. 5,853,847 and National Application PCT/JP94/01184). According to the technology of the above patent, it is made possible to obtain a CoNiCr magnetic film or a CoCrTa magnetic film having a high coercive force within a range from 2700 to 3000 Oe by purifying the film forming atmosphere and control the ultimate vacuum degree to $3\times10^{-9}$ Torr ($400\times10^{-9}$ Pa) or less and by dry-eyching using an Ar gas containing about 1 ppb of impurities such as $H_2O$, the surface of the substrate, on which an underlayer of Cr is formed, to remove impurities such as oxides from the surface of the substrate. This kind of a magnetic film obtained by general film forming processes usually exhibits a coercive force within a range from about 1500 to 2000 Oe.

However, considerable progress has been made in magnetic recording media and it is required to develop a more excellent magnetic film in place of the CoCrTa alloy magnetic film or CoCrTaPt alloy magnetic film. It is also required to develop a magnetic film which exhibits excellent magnetic characteristics under general film forming conditions without using the above ultra clean process.

An object of the present invention is to provide a magnetic alloy which has a high normalized coercive force, suppresses thermal agitation and also has thermally stable magnetic characteristics, or a magnetic recording medium comprising a magnetic film made of the alloy.

Another object of the present invention is to provide a method of producing a magnetic recording medium having the above characteristics.

Still another object of the present invention is to provide a target suited for use in the production of a magnetic recording media having the above characteristics.

Yet another object of the present invention is to provide a magnetic recording device comprising a magnetic recording medium having the above excellent characteristics.

DISCLOSURE OF THE INVENTION

The magnetic alloy of the present invention is a magnetic alloy consisting essentially of cobalt (Co), chromium (Cr) and germanium (Ge), the composition of said magnetic alloy being represented by the general formula:

$Co_xCr_yGe_z$ where x, y and z, which represent the composition ratio, satisfy the relationships: $78 \leq x \leq 87$, $2.5 \leq y \leq 25$, $2 \leq z \leq 15$, and x+y+z=100 (provided that x, y, and z represent the composition ratio in terms of atomic %).

According to the magnetic alloy with the above composition, it is possible to obtain a magnetic alloy which has magnetic characteristics capable of accommodating increases in recording density, i.e. both a high normalized coercive force and magnetocrystalline anisotropy, and also has a more excellent magnetic anisotropy field.

In the present invention, the composition ratio can preferably satisfy the relationships: $82 \leq x \leq 87$, $2.5 \leq y \leq 13$, and $2.5 \leq z \leq 14$.

With a composition within the above range, the relationship $4\pi Ms/H_k^{grain} \leq 1.0$, which is the condition required to obtain a high normalized coercive fore($Hc/H_k^{grain}$) of 0.35 or more, is secured to obtain a magnetocrystalline anisotropy ($K_u^{grain}$) of $1.5 \times 10^6$ erg/cm$^3$ or more, thus making it possible to form a magnetic alloy which also has thermally stable magnetic characteristics.

The magnetic alloy of the present invention is a magnetic alloy consisting essentially of cobalt (Co), chromium (Cr), germanium (Ge), and an element T (T represents one or more of the elements of Ta, Si, Nb, B, Ni, and Pt), the composition of said magnetic alloy being represented by the general formula:

$(Co_xCr_yGe_z)_{100-c}T_c$ where x, y, z, and c, which represent the composition ratio, satisfy the relationships: $60 \leq x \leq 87$, $2.5 \leq y \leq 25$, $2 \leq z \leq 15$, $c \leq 20$, and x+y+z=100 (provided that x, y, z, and c represent a composition ratio in terms of atomic %).

In the magnetic alloy of the present invention, the composition ratio can satisfy the relationships: $60 \leq x \leq 87$, $2.5 \leq y \leq 13$, and $2.5 \leq z \leq 14$.

In the magnetic alloy of the present invention, c, which represents the composition ratio of said element T, can be controlled to 5 atomic % or less if said element T represents one or more elements of Ta, Si and Nb, and c, which represents a composition ratio of said element T, can be controlled to 9 atomic % or less in case said element T is B.

The magnetic alloy of the present invention is a magnetic alloy consisting essentially of cobalt (Co), chromium (Cr), germanium (Ge), platinum (Pt), and an element T' (T' represents one or more elements of Ta and B), the composition of said magnetic alloy being represented by the general formula:

$(Co_xCr_yGe_zPt_v)_{100-c'}T'_{c'}$ where x, y, z, v, and c', which represent the composition ratio, satisfy the relationships: $45 \leq x \leq 87$, $2.5 \leq y \leq 25$, $2 \leq z \leq 15$, $2 \leq v \leq 25$, and $1 \leq c' \leq 12$ (provided that x, y, z, v and c' represent a composition ratio in terms of atomic %).

According to the magnetic alloy of these compositions, it is easy to obtain a low medium noise, a high signal output and an excellent S/N ratio, in addition to excellent magnetic characteristics of the CoCrGe ternary alloy described above.

In the magnetic alloy of the present invention, c, which represents the composition ratio of B, can be controlled to 1 atomic % or more and 8 atomic % or less if said T' is B.

In the magnetic alloy of the present invention, c, which represents the composition ratio of Ta, can be controlled to 1 atomic % or more and 8 atomic % or less in case said T' is Ta.

With compositions within the above range, it is possible to securely obtain a low medium noise, a high signal output and an excellent S/N ratio, in addition to excellent magnetic characteristics of the CoCrGe ternary alloy described above.

The present invention is characterized by a magnetic recording medium comprising a substrate and a ferromagnetic metal magnetic film formed on said substrate via a metallic underlayer, said ferromagnetic metal magnetic film being a magnetic film made of a ternary alloy consisting of cobalt (Co), chromium (Cr), and germanium (Ge), an alloy composition of said ferromagnetic metal magnetic film being represented by the general formula:

$Co_xCr_yGe_z$ where x, y and z, which represent a composition ratio, satisfy the relationships: $60 \leq x \leq 87$, $2.5 \leq y \leq 25$, $2 \leq z \leq 15$, and x+y+z=100 (provided that x, y and z represent a composition ratio in terms of atomic %).

According to the ferromagnetic metal magnetic film of a magnetic alloy with the above composition, it is possible to obtain a magnetic recording medium which has magnetic characteristics capable of accommodating increases in the recording density, i.e. both a high normalized coercive force and magnetocrystalline anisotropy, even when using a conventional film forming process utilizing a film forming chamber, the ultimate vacuum degree of which is on the order of $10^{-6}$ Torr.

In the magnetic recording medium of the present invention, the composition ratio of said ferromagnetic metal magnetic film can satisfy the relationships: $82 \leq x \leq 87$, $2.5 \leq y \leq 13$, and $2.5 \leq z \leq 14$.

With a composition within the above range, the relationship $4\pi Ms/H_k^{grain} \leq 1.0$, which is the condition required to obtain a high normalized coercive force ($Hc/Hk^{grain}$) of 0.35 or more, is secured to obtain a ferromagnetic metal magnetic film having a magnetocrystalline anisotropy ($K_u^{grain}$) of $1.5 \times 10^6$ erg/cm$^3$ or more, thus making it possible to form a magnetic recording medium which also has thermally stable magnetic characteristics.

The present invention is characterized by a magnetic recording medium comprising a substrate and a ferromagnetic metal magnetic film formed on said substrate via a metallic underlayer, said ferromagnetic metal magnetic film being a magnetic film consisting essentially of cobalt (Co), chromium (Cr), germanium (Ge), and an element T (T represents one or more of the elements Ta, Si, Nb, B, Ni, and Pt), the composition of said magnetic alloy being represented by the general formula:

$(Co_xCr_yGe_z)_{100-c}T_c$ where x, y, z, and c, which represent the composition ratio, satisfy the relationships: $60 \leq x \leq 87$, $2.5 \leq y \leq 25$, $2 \leq z \leq 15$, $c \leq 20$, and x+y+z=100 (provided that x, y and z represent the composition ratio in terms of atomic %).

In the present invention, the composition ratio of said ferromagnetic metal magnetic film can satisfy the relationships: $73 \leq x \leq 87$, $2.5 \leq y \leq 13$, and $2.5 \leq z \leq 14$.

In the present invention, c, which represents the composition ratio of said element T, can be controlled to 5 atomic % or less if said element T represents one or more of the elements Ta, Si and Nb, and c, which represents the composition ratio of said element T, can be controlled to 9 atomic % or less in case said element T is B.

The present invention is characterized by a magnetic recording medium comprising a substrate and a ferromagnetic metal magnetic film formed on said substrate via a metallic underlayer, said ferromagnetic metal magnetic film being a magnetic film consisting essentially of cobalt (Co), chromium (Cr), germanium (Ge), platinum (Pt), and an element T' (T' represents one or more of the elements Ta and B), the composition of said magnetic alloy being represented by the general formula:

$$(Co_xCr_yGe_zPt_v)_{100-c'}T'_{c'}$$

where x, y, z, v, and c', which represent the composition ratio, satisfy the relationships: $45 \leq x \leq 87$, $2.5 \leq y \leq 25$, $2 \leq z \leq 15$, $2 \leq v \leq 25$, and $1 \leq c' \leq 12$ (provided that x, y, z, v, and c' represent the composition ratio in terms of atomic %).

According to the ferromagnetic metal magnetic film of these compositions, it is easy to obtain a low medium noise, a high signal output and an excellent S/N ratio, in addition to excellent magnetic characteristics of the CoCrGe ternary alloy described above.

In the present invention, c', which represents the composition ratio of B, can be controlled to 1 atomic % or more and 8 atomic % or less in case said T' is B.

In the present invention, c', which represents the composition ratio of Ta, can be controlled to 1 atomic % or more and 8 atomic % or less in case said T' is Ta.

With a composition within the above range, it is made possible to securely obtain a low medium noise, a high signal output and an excellent S/N ratio, in addition to excellent magnetic characteristics of the CoCrGe ternary alloy described above.

The present invention is characterized by forming at least a ferromagnetic metal magnetic film on a metallic underlayer using any of the sputtering, vacuum deposition, CVD, ion beam, or laser deposition film forming methods in the production of the magnetic recording medium described above.

By carrying out this film forming method, it is made possible to obtain the desired magnetic recording medium comprising a substrate and a ferromagnetic metal magnetic film having excellent magnetic characteristics formed on the substrate.

In the present invention, a film can be formed in a non-bias state where an electrical bias is not applied to a substrate in case of forming at least a ferromagnetic metal magnetic film on a metallic underlayer in the production of the magnetic recording medium described above.

According to the magnetic recording medium comprising the above CoCrGe ternary alloy magnetic film having a specific composition ratio or the CoCrGeT or CoCrGeT' alloy magnetic film having the above specific composition, a film can be formed in a non-bias state without applying a bias to a substrate so that an insulating glass having excellent evenness can be employed as the substrate. Furthermore, the magnetic recording medium has the feature defects due to application of the bias to the substrate during production can be prevented, thereby making stable production possible to.

In the present invention, the above ferromagnetic metal magnetic film can be formed on a substrate by means of sputtering using at least a composite target comprising Cr chips and Ge chips placed thereon in case of carrying out the method described above.

The present invention is characterized by disposing a substrate in a film forming chamber, forming a metallic underlayer on said substrate using a target for forming an underlayer provided in said film forming chamber, and forming a ferromagnetic metal magnetic film on said metallic underlayer in said film forming chamber using a target for forming a ferromagnetic metal magnetic film disposed in the film forming layer after forming the metallic underlayer in case of carrying out the method described above.

The present invention is characterized by a target for forming a magnetic film, consisting essentially of cobalt (Co), chromium (Cr) and germanium (Ge), the composition of said target being represented by the general formula:

$$Co_xCr_yGe_z$$

where x, y and z, which represent the composition ratio, satisfy the relationships: $78 \leq x \leq 87$, $2.5 \leq y \leq 25$, $2 \leq z \leq 15$, and x+y+z=100 (provided that x, y, and z represent the composition ratio in terms of atomic %).

The present invention is characterized in that said composition ratio satisfies the relationships: $82 \leq x \leq 87$, $2.5 \leq y \leq 13$, $2.5 \leq z \leq 14$, and x+y+z=100.

The present invention is characterized by a target for forming a magnetic film, consisting essentially of cobalt (Co), chromium (Cr), germanium (Ge), and an element T (T represents one or more of the elements Ta, Si, Nb, B, Ni and Pt), the composition of said target being represented by the general formula:

$$(Co_xCr_yGe_z)_{100-c}T_c$$

where x, y, z and c, which represent the composition ratio, satisfy the relationships: $60 \leq x \leq 87$, $2.5 \leq y \leq 25$, $2 \leq z \leq 15$, $c \leq 20$, and x+y+z=100 (provided that x, y, z, and c represent the composition ratio in terms of atomic %).

Using a target with such a composition, a ferromagnetic metal magnetic film having excellent magnetic characteristics with the composition described above can be obtained by means of a film forming method such as sputtering.

In the present invention, said composition ratio can preferably satisfy the relationships: $73 \leq x \leq 87$, $2.5 \leq y \leq 13$, and $2.5 \leq z \leq 14$.

According to the target with such a composition within the above range, the relationship $4\pi Ms/H_k^{grain} \leq 1.0$, which is the condition required to obtain a high normalized coercive force (Hc/Hk$^{grain}$) of 0.35 or more, is secured, thus making it possible to form a magnetic recording medium comprising a ferromagnetic metal magnetic film, which has a magnetocrystalline anisotropy ($K_u^{grain}$) of $1.5 \times 10^6$ erg/cm$^3$ and also has thermally stable magnetic characteristics.

The present invention may be characterized in that c, which represents the composition ratio of said element T, is 5 atomic % or less if said element T represents one or more of the elements Ta, Si and Nb, and c, which represents the composition ratio said element T, is 9 atomic % or less if said element T is B.

The target of the present invention may be characterized by a target for forming a magnetic film, consisting essentially of cobalt (Co), chromium (Cr), germanium (Ge), and an element T' (T' represents one or more of the elements Ta and B), the composition of said target being represented by the general formula:

$$(Co_xCr_yGe_zPt_v)_{100-c'}T'_{c'}$$

where x, y, z, v, and c', which represent the composition ratio, satisfy the relationships: $45 \leq x \leq 87$, $2.5 \leq y \leq 25$, $2 \leq z \leq 15$, $2 \leq v \leq 25$, and $1 \leq c' \leq 12$ (provided that x, y, z, v, and c' represent the composition ratio in terms of atomic %).

The target may also have a composition ratio satisfying the relationships: $82 \leq x \leq 87$, $2.5 \leq y \leq 13$, and $2.5 \leq z \leq 14$.

It may also be a target, wherein c, which represents a composition ratio of B, is 1 atomic % or more and 8 atomic % or less in case said T' is B.

The target may also have a value of c, which represents the composition ratio of Ta, of 1 atomic % or more and 8 atomic % or less if said T' is Ta.

According to a target with a composition within the above range, the relationship $4\pi Ms/H_k^{grain} \leq 1.0$, which is the condition required to obtain a high normalized coercive force (Hc/Hk$^{grain}$) of 0.35 or more, is secured, thus making it possible to form a magnetic recording medium comprising a ferromagnetic metal magnetic film which has magnetocrystalline anisotropy ($K_u^{grain}$) of $1.5 \times 10^6$ erg/cm$^3$ and also has thermally stable magnetic characteristics.

The magnetic recording device of the present invention is characterized by comprising the above magnetic recording medium, a driving section for driving said magnetic recording medium, a magnetic head, and a moving means for moving said magnetic head relatively to said magnetic recording medium.

Since the magnetic recording device comprises the above-described magnetic recording medium having excellent magnetic characteristics, it is possible to provide an excellent magnetic recording device which can accommodate increases of the recording density and has a great resistance to thermal agitation, and which also has a low medium noise and can enhance the signal output.

The magnetic recording device of the present invention is characterized in that the reproduction section of said magnetic head consists of a magnetic resistance effect type magnetic element.

Since the magnetic head, a reproduction section of which consists of a magnetic resistance effect type magnetic element, accommodate the increases of the recording density of the magnetic recording medium and can also read fine magnetic information, it is possible to provide an excellent magnetic recording device which can accommodate increases of the recording density and has a great resistance to thermal agitation, and which also has a low medium noise and can enhance the signal output.

BEST MODE FOR CARRYING OUT THE INVENTION

Figure 1:
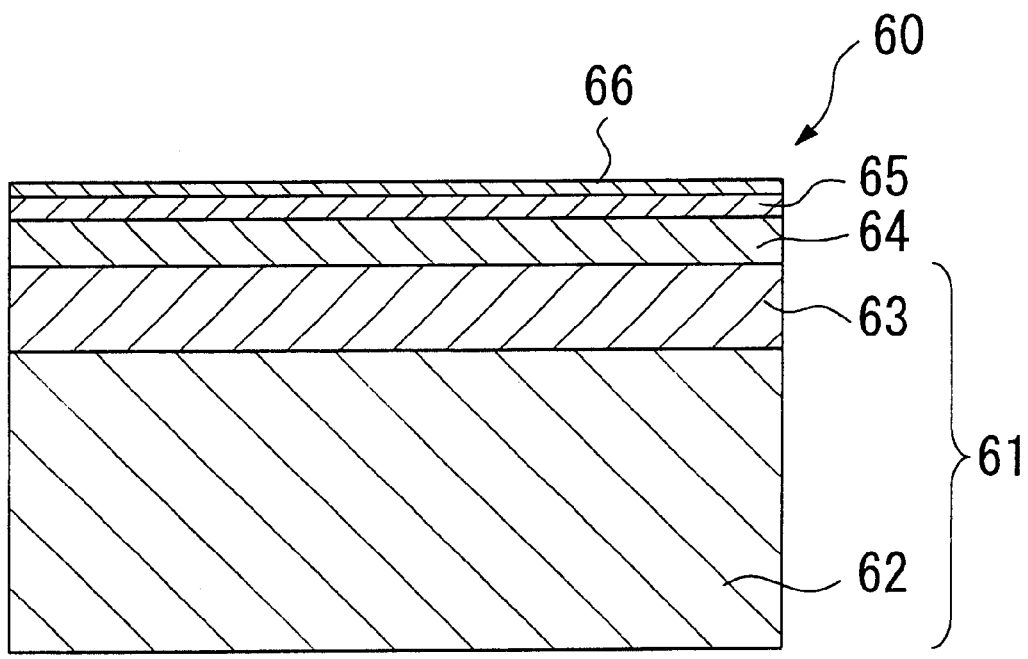
FIG. 1 is a cross-sectional view of a magnetic recording medium of the first embodiment according to the present invention.

In light of the previously described background, the present inventors have carried out intensive studies on magnetic materials and recently obtained the following results. Thus, the present invention has been completed based on these results.

We have already reported in the following literature ("Physics of High Density Recording Thin Film Media Established by Ultra Clean Sputtering Processes" by M. Takahashi and H. Shoji, J. Magn. Magn. Mater, 193 (1999) 44–51) in March, 1999 that reduction of the intergranular interaction of grains constituting a magnetic film, which serves as a recording layer 55, and reduction of the film thickness of a magnetic film are indispensable to improving the recording/reproduction characteristics in the above magnetic recording medium 50.

Furthermore, the following fact also became apparent from the present inventors' recent study. That is, there arises the problem that magnetic characteristics such as magnetization (remanent magnetization) recorded on the magnetic film drastically varies over time due to refinement of grains, which constitute the magnetic film, caused by the reduction of the film thickness of the magnetic film which constitutes the recording layer 55, namely, there is the problem that thermal agitation is likely to exert an effect. The contents of this study have already been published in the literature described above.

On the basis of the contents of the publication of the results of the study, the present inventors have found that size reduction of the magnetization pattern to be recorded on the magnetic film is required to increase the recording density on the magnetic film and refinement of the grains which constitute the magnetic film has a significant effect on thermal agitation.

The present inventors disclosed in National Application PCT/JP94/01184 that a magnetic film constituting the recording layer 55 is preferably a magnetic film, which has a high coercive force (Hc) and high magnetic anisotropy field ($H_k^{grain}$) and also has a normalized coercive force of 0.3 or more to realize a magnetic recording medium for high-density recording having excellent recording/reproduction characteristics and that a recording medium having such magnetic characteristics can be made by using an ultra clean process.

As used herein, the term "normalized coercive force ($Hc/H_k^{grain}$)" refers to a value obtained by dividing the coercive force Hc by the magnetic anisotropy field ($H_k^{grain}$) of the grains of the magnetic film and means the degree of the magnetic isolation of the grains of the magnetic film.

A high normalized coercive force ($Hc/H_k^{grain}$) of the magnetic film means that the magnetic interaction of each of the grains which constitute the magnetic film is lowered, thereby making it possible to realize a high coercive force. For example, if fine grains of Co are dispersed in the texture in a CoCr-based magnetic film, it is considered desirable to magnetically isolate each of the Co grains and to lower the magnetic interaction between the Co grains.

The same publication discloses that the above ultra clean process makes it possible to form a magnetic recording medium utilizing magnetization reversal, in which the oxygen concentration of a metallic underlayer and/or a ferromagnetic metal layer is 100 ppm by weight or less, and that film forming conditions of the ultra clean process for forming such a magnetic recording medium and film forming conditions of a conventional general process differ in the following point.

Comparing the film forming conditions of the ultra clean process with those of a conventional general process, the back pressure of a film forming chamber is in the order of $10^{-9}$ Torr ($10^{-7}$ Pa) in case of the ultra clean process, whereas, the back pressure of a film forming chamber is in the order of $10^{-7}$ Torr ($10^{-5}$ Pa) in case of a conventional general film forming process. Furthermore, an Ar gas used in the formation of a film is UC-Ar (ultra clean argon: Ar "ultra clean Ar" having an impurity concentration of 100 ppt or less, and preferably 10 ppb or less) in case of an ultra clean process, whereas, the Ar gas is normal-Ar (having an impurity concentration of 1 ppm or more) in the case of a conventional film forming process.

National Application PCT/JP97/01092 filed by the present inventors discloses that a high normalized coercive force ($Hc/H_k^{grain}$) of 0.35 or more can be obtained by enabling the relationship between the saturation magnetization (Ms) and magnetic anisotropy field ($H_k^{grain}$) of the magnetic film, which constitutes the recording layer 55, to satisfy the relationship $4\pi Ms/H_k^{grain} \leq 1.0$ without depending on the grain size of the magnetic film, and that a magnetic medium which satisfies the relationship $4\pi Ms/H_k^{grain} \leq 1.0$ is formed by using an ultra clean process (technology disclosed in National Application PCT/JP94/01184).

In the literature ("Physics of High Density Recording Thin Film Media Established by Ultra Clean Sputtering Processes" by M. Takahashi and H. Shoji, J. Magn. Magn. Mater, 193 (1999) 44–51), the present inventors made it clear, in March, 1999, that the reduction of the magnetic film thickness causes refinement of the grains which constitute the magnetic film, and an influence of thermal agitation is likely to exert in effect and that a material having a larger magnetocrystalline anisotropy ($K_u^{grain}$) of the magnetic film causes a smaller change in the remanent magnetization over time.

For example, a maximum value of the magnetocrystalline anisotropy ($K_u^{grain}$) of a Co-based alloy film, which is widely used as a magnetic film in a conventional magnetic recording medium, was about $1.3 \times 10^6$ erg/cm$^3$ in the case of a CoNiCr alloy film, while it is about $1.4 \times 10^6$ erg/cm$^3$ in the case of a CoCrTa alloy film.

The present inventors reported in the literature described below on October, 1997 that a magnetocrystalline anisotropy ($K_u^{grain}$) of about $2.5 \times 10^6$ erg/cm$^3$ can be obtained in case of a CoCrTaPt alloy film formed by the ultra clean process, which has recently been developed, and this value has the highest in thermal stability of a conventional Co-based material.

However, it is assumed that, with such a material composition, the normalized coercive force ($Hc/H_k^{grain}$) is small, such as 0.3, even if the value of the magnetocrystalline anisotropy ($K_u^{grain}$) is somewhat large and the medium noise is small.

The reference referred to above is CoCrPt Thin Film Magnetic Recording Medium Made in a Clean Atmosphere (Magnetic Anisotropy and Fine Structure), Takahashi laboratory, Akira KIKUCHI, Haruhito MITSUYA, Satoru YOSHIMURA, Hiroki SHOJI, Digest of the 21st Annual Conference of the Japan Applied Magnetics Society (1997), p165.

The present inventors consider that the size of the magnetization pattern to be recorded on the magnetic film is further reduced with an increase in the recording density and a magnetic film is required which does not undergo a large change of the magnetic characteristics such as remanent magnetization over time even if the size of grains which constitute the magnetic film is further reduced by reducing the film thickness of the magnetic film, to accommodate an increase of the recording density, that is, a magnetic film is required which suppresses thermal agitation, thereby making it possible to thermally stabilize the magnetic characteristics.

In other words, the present inventors consider that it is required to develop a magnetic recording medium which has $4\pi Ms/H_k^{grain}$, as an indication of the magnetic grain size and magnitude of the magnetostatic interaction, of 1 or less and also has a high magnetocrystalline anisotropy as compared with a conventional medium.

The present inventors have carried out further studies on the basis of the background described above. As a result, the present inventors been the first to indicate that a reduction of the intergranular interaction, suppression of the magnetostatic interaction, grain refinement, the relationship between the magnetic film thickness and remanent magnetic flux density, and the relationship between the magnetic grain size and relaxation time are important as an index of the development of materials in order to develop a magnetic recording medium which can accommodate ultra-high densities at a level ranging from 10 to 1000 Gb/in² in "Physics of High Density Recording Thin Film Media Established by Ultra Clean Sputtering Processes" by M. Takahashi and H. Shoji, J. Magn. Magn. Mater, 193 (1999), 44–51, published on February, 1999, or Applied Physics, Vol. 68, No. 2, pp185–189, 1999, published in February 1999.

As used herein, the term "reduction of the intergranular interaction" refers to control of the value of the above-described normalized coercive force in which the coercive force (Hc) was normalized by the magnetic anisotropy field $H_k^{grain}$ of the grains and it is necessary that the coercive force be 0.3 or more and preferably, it exceeds 0.35. The present inventors consider that an ideal structure in these kinds of magnetic films is a state wherein many fine ferromagnetic grains are magnetically isolated by a non-magnetic layer having a proper thickness and dispersed. Although the larger the normalized coercive force, the better, the normalized coercive force is about 0.3 in case of a CoCrTa magnetic thin film used at present, while it is smaller than 0.3 in case of a CoCtTaPt magnetic thin film.

As used herein, the term "suppression of the magnetostatic interaction" refers to satisfying the condition ($4\pi Ms/H_k^{grain}$) 1.0 and the value of the normalized coercive force can be controlled to 0.35 or more by satisfying this condition. The present inventors have made it clear in the literature described above that the normalized coercive force is lowered with the reduction of the grain size in the case of a magnetic recording medium wherein ($4\pi Ms/H_k^{grain}$) is about 1.5.

The present inventors have also published in the literature described above that grain refinement of the magnetic film is also important to lower the noise of the magnetic recording medium and the grain size is preferably controlled to 10 nm or less to do so.

As used herein, the term "relationship between the magnetic film thickness and remanent magnetic flux density" means to satisfy the relationship: tBr<50 G μm where t denotes the film thickness of a magnetic film and Br denotes the remanent magnetic flux density.

As used herein, the term "relationship between the magnetic grain size and relaxation time" refers to such results that for a conventional CoCrTa magnetic film if the attenuation value over one year is determined by the time dependence of the remanent magnetization, the value of $vK_u^{grain}/KT$ of 40 or more is effective to suppress the thermal agitation (where v denotes the volume of the magnetic grains, ($K_u^{grain}$) denotes the magnetic anisotropy field of a magnetic film, K denotes Boltzmann's constant, and T denotes the temperature), which was published in the literature described above by the present inventors. Here, $vK_u^{grain}/KT$ is an indication factor of the degree of magnetic energy. The present inventors have found that the attenuation of the remanent magnetization drastically increases in one year when the value of the above formula is 40 or less.

It is considered that the magnetization is directed towards a direction in which the energy of the system is minimized and the direction does not vary over time, however, due to the existence of thermal energy, relaxation of magnetization over the energy barrier occurs stochastically and statistically. According to recent studies by the present inventors, assuming that a requisite relaxation time of about $10^8$ s is required, the value of ($K_u^{grain}$) must be $1.5 \times 10^6$ erg/cm² or more, preferably about $2.0 \times 10^6$ erg/cm² or more, more preferably about $2.5 \times 10^6$ erg/cm² or more, and most preferably about $3.0 \times 10^6$ erg/cm² so that the relaxation time exceeds about $10^8$ s. The contents thereof also have been published in the literature described above.

However, at present no magnetic material which satisfies the respective indications described above with good balance has been known. Therefore, the present inventors have intensively studied magnetic materials to satisfy these indications as much as possible, thus completing the present invention.

The best mode for carrying out the present invention will be described in detail, but the present invention is not limited by these embodiments.

FIG. 1 is a partial cross-sectional view of a structure of an embodiment wherein a magnetic recording medium of the present invention is applied to an HDD (hard disk) of a computer, and the magnetic recording medium 60 of this embodiment has a structure which comprises a substrate 61 comprising a base 62 made of a disk-shaped non-magnetic material and a non-magnetic layer 63 formed on the base, and a ferromagnetic metal magnetic film (magnetic recording layer) 65 and a protective layer 66 laminated on the substrate via a metallic underlayer 64.

Figure 19:
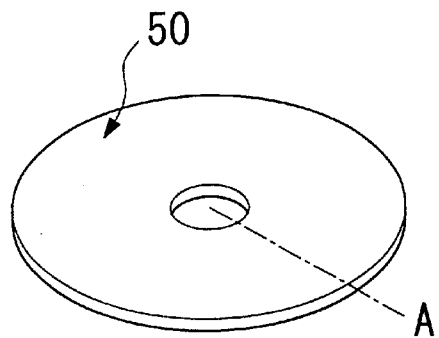
FIG. 19 is a schematic perspective view showing a conventional hard disk as an example of a magnetic recording medium.

The laminated structure of the magnetic recording medium 60 of this embodiment shown in FIG. 1 is the most general structure of an HDD so that the structure may have another intermediate layer optionally formed between the base 62 and the protective layer 66, and may also be a structure wherein a lubricating layer made of a fluororesin is formed on the protective layer 66, as a matter of course. In FIG. 1, only a partial cross-sectional structure of the magnetic recording medium 60 is shown, but the entire shape thereof is a disk shape which is the same as that of a conventional magnetic recording medium 50 shown in FIG. 19.

The magnetic recording medium 60 of this embodiment is a magnetic recording medium comprising a substrate 61 and a ferromagnetic metal magnetic film 65 formed on the substrate 61 via a metallic underlayer 64, the ferromagnetic metal magnetic film 65 being a CoCrGe ternary alloy magnetic film or a quarternary, quinary, sexanary or multiple ferromagnetic metal magnetic film obtained by adding the required elements to the ternary alloy magnetic film.

The magnetic recording medium 60 as the embodiment of the present invention will be described in more detail.

Substrate

The substrate 61 in the present invention includes, for example, those obtained by coating the surface of a base 62 made of aluminum and alloys or oxides thereof, titanium and alloys or oxides thereof, or silicon, glass, carbon, ceramic, plastic, resin and composites there of with a non-magnetic layer 63 made of a different kind of a material using a film forming method such as sputtering method, deposition method, or plating method.

It is preferable that non-magnetic layer 63 formed on the surface of the substrate 61 is not magnetized at high temperature and has electric conductivity and is also easily machined, while having a proper surface hardness. A Ni—P film formed by a plating method is preferable as the non-magnetic film which satisfies these conditions. A glass substrate may be used as the substrate 61 without forming the non-magnetic layer 63.

In case of an application for to a disk, a doughnut-disk-shaped substrate 61 is used. A substrate with a magnetic layer described hereinafter, i.e. a magnetic recording medium is used while rotating about a center of the disk as an axis at a speed within a range from 3600 to 15000 rpm during the magnetic recording and reproduction. At this time, a magnetic head runs while levitating magnetically above the surface or back surface of the magnetic recording medium at a height of about 0.1 μm or several tens of nm. In the case of lower magnetic levitation, a magnetic head capable of running while levitating magnetically at a height of about 10 nm has also been developed.

Accordingly, the substrate 51 may preferably be a substrate wherein the evenness of the surface or back surface, parallelism between the obverse surface and reverse surface, the waviness of the substrate in the circumferential direction, and the roughness of the obverse surface and reverse surface are properly controlled.

When the substrate rotates and stops, the surface of the magnetic recording medium and that of the magnetic head contact, and slide with respect to each other (Contact Start Stop, hereinafter referred to as "CSS"). To cope with CSS, concentric slight scratches (texture) are sometimes formed on the surface of the substrate by polishing using a diamond slurry or tape, thereby to prevent stiction of the magnetic head on contacting.

Figure 20:
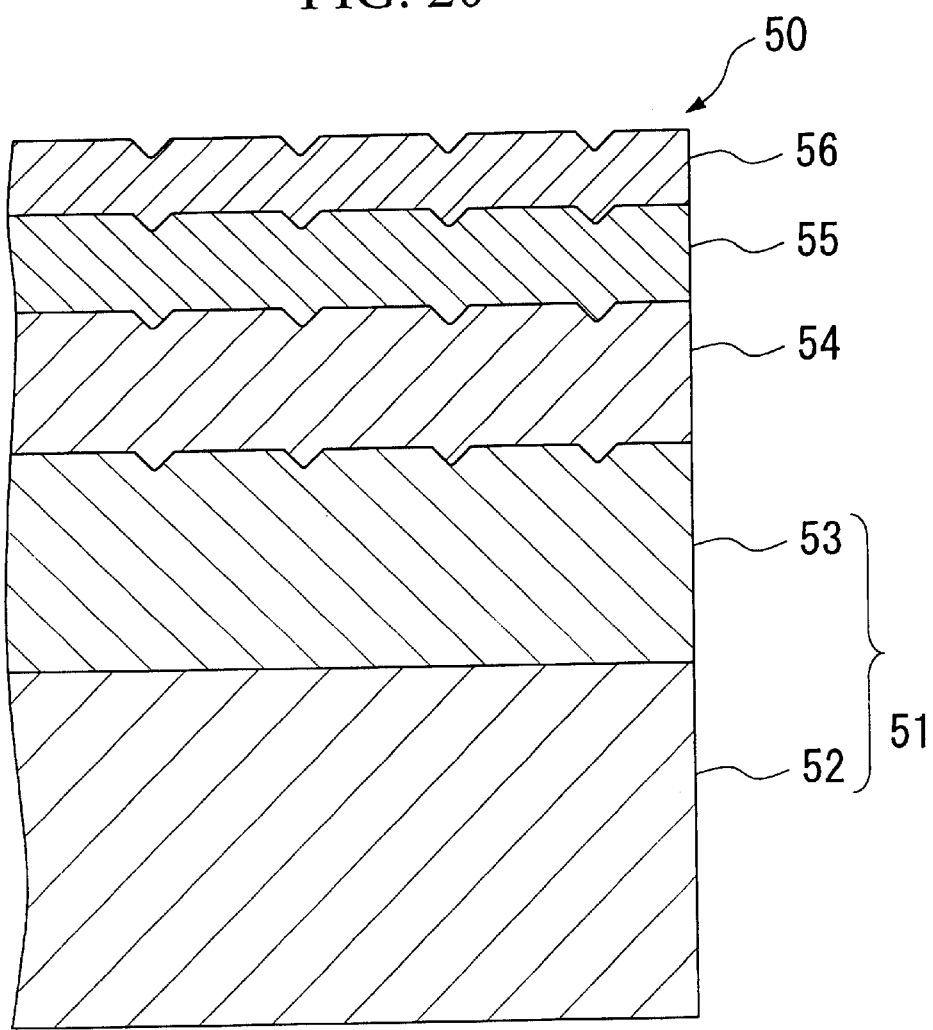
FIG. 20 is a diagram showing a partial sectional structure of a conventional hard disk as an example of a magnetic recording medium.

Since a V-shaped texture is generally formed by scratching the top of a Ni—P non-magnetic layer 53 using an abrasive paper, as shown in a conventional structure in FIG. 20, a texture may be formed on the surface of the non-magnetic layer 63 made of Ni—P in the structure of this embodiment. There is also known a structure wherein a texture by means of laser machining, a scattered uneven film texture by means of sputtering or an uneven texture by means of etching of a protective film is formed in place of a texture by means of a diamond slurry or tape. Therefore, unevenness with a desired shape may be formed on the top of the non-magnetic layer 63 by employing such a structure, as a matter of course. Also there has recently been developed a structure wherein a magnetic head is on standby outside a magnetic recording medium using a load/unload system, so that the texture can also be omitted when employing such a system.

Metallic Underlayer

A metallic underlayer 64 used in this embodiment includes, for example, Cr and alloy's thereof. In the case of an alloy, combinations with Mo, W, Ti, V, Nb and Ta are employed. More specifically, a CrMo alloy, a CrW alloy, a CrTi alloy and a CrV alloy are applied.

Cr is particularly preferable because it causes a segregation action on a magnetic metal magnetic film 65 described hereinafter. These materials are widely used because they are mass-produced, and a sputtering method and a deposition method are used as the film forming method. This metallic underlayer 64 serves to promote the grain growth of the ferromagnetic metal magnetic film 65 so that an axis of easy magnetization of the ferromagnetic metal magnetic film 65 is in a substrate longitudinal direction, that is, the coercive force in the substrate longitudinal direction increases when the ferromagnetic metal magnetic film 65 is formed on the metallic underlayer 64.

When using a glass plate as the substrate, a Ni—Al seed layer may be further formed under the metallic underlayer.

If the metallic underlayer 64 is formed of Cr, a film forming factor capable of controlling the crystallizability include, for example, the surface configuration, surface state or surface temperature of the substrate, the gas pressure during the film forming, the bias applied to the substrate, and the thickness of the film to be formed.

Although the coercive force of the ferromagnetic metal magnetic film 65 described hereinafter tends to increase in proportion to the film thickness of Cr, the surface roughness of the medium tends to increase with the increase of the coercive force. However, it is required to reduce the levitation height of the magnetic head from the surface of the magnetic recording medium as much as possible in order to improve the recording density. Accordingly, it is preferred to use a metallic underlayer 64 made of a material which makes it possible to obtain a high coercive force regardless even if the film thickness of the metallic underlayer 64 is small.

Ferromagnetic Metal Magnetic Layer

As a kind of a magnetic film made of a ternary ferromagnetic alloy, which constitutes the ferromagnetic metal magnetic film 65 used in this embodiment, there can be used a magnetic film made of a magnetic alloy represented by the general formula:

$Co_xCr_yGe_z$ where x, y and z, which represent the composition ratio, satisfy the relationships: $78 \leq x \leq 95.5, 2.5 \leq y \leq 25, 2 \leq z \leq 15$, and x+y+z=100 (provided that x, y, and z represent the composition ratio in terms of atomic %).

It is considered that the magnetic material has a structure in which a non-magnetic intergranular layer is formed around magnetic grains which shows ferromagnetism, and it is necessary to control the mutual distance between magnetic grains to a proper value by adjusting the grain size of the magnetic grains to 10 nm or less, reduce the intergranular interaction between the magnetic grains, and suppress the magnetostatic interaction between the magnetic grains.

With the composition within the above range, it is possible to secure the relationship $(4\pi Ms/H_k^{grain} \leq 1.0)$, which is the condition required to obtain a high normalized coercive force $(Hc/H_k^{grain})$ of 0.35 or more, without depending on the grain size of the ferromagnetic metal magnetic film 65. Among compositions within this range, the relationship $(4\pi Ms/H_k^{grain}) \leq 1.0$ can be securely obtained when the composition ratio satisfies the relationships: $78 \leq x \leq 87, 2.5 \leq y \leq 14.5$, and $3.5 \leq z \leq 15$.

With the compositions within the above range, a magnetocrystalline anisotropy $(K_u^{grain})$ of $1.5 \times 10^6$ erg/cm³ or more can be obtained, thus making it possible to provide a magnetic recording medium which also has thermally stable magnetic characteristics.

Particularly, when using the CoCrGe alloy of the present invention, the ferromagnetic metal magnetic film 65 may be produced by using the ultra clean process described in the Background Art. However, the ultra clean process does not necessarily have to be used. It is also possible to obtain a metallic magnetic film which realizes the magnetic characteristics described above by using a film forming process under general conditions.

When using the ferromagnetic metal magnetic film 65 made of a magnetic alloy represented by the general formula:

$Co_xCr_yGe_z$ where x, y and z, which represent the composition ratio, satisfy the relationships: $82 \leq x \leq 87, 2.5 \leq y \leq 13, 2.5 \leq z \leq 14$, and x+y+z=100 (provided that x, y and z represent the composition ratio in terms of atomic %), there can be provided an excellent magnetic film having a magnetocrystalline anisotropy ($K_u^{grain}$) of $2.0 \times 10^6$ erg/cm³ or more, which has never been reported in the case of using a conventional Co-based ferromagnetic metallic material, thus making it possible to obtain a magnetic recording medium which has more excellent thermally stability.

For the purpose of enhancing the coercive force and saturation magnetization, one or more additive element T selected from Ni, Pt, Ta and Si may be appropriately added to the magnetic film of the above composition.

As the magnetic film wherein these elements are added, for example, there can be used a magnetic film made of a ferromagnetic metal consisting essentially of Co, Cr, Ge, and an element T (T represents one or more elements of Ta, Pt, Ni, Si, Nb, and B).

The composition of said ferromagnetic metal being represented by the general formula:

$$Co_x Cr_y Ge_z T_c$$

where x, y, z, and c, which represent the composition ratio, satisfy the relationships: $80 \leq x \leq 95.5$, $2.5 \leq y \leq 25$, $2 \leq z \leq 15$, $c \leq 5$, and $x+y+z=100$ (provided that x, y, z and c represent the composition ratio in terms of atomic %).

The composition ratio of the ferromagnetic metal magnetic film preferably satisfies the relationships: $73 \leq x \leq 87$, $2.5 \leq y \leq 14.5$, $3.5 \leq z \leq 15$, and $1 \leq c \leq 12$, and more preferably satisfies the relationships: $82 \leq x \leq 95.5$, $2.5 \leq y \leq 13$, $2.5 \leq z \leq 14$, and $c \leq 5$.

Specific compositions include, for example, CoCrGeTa, CoCrGePt, CoCrGeB, CoCrGeTaPt, CoCrGeTaB, and CoCrGeTaPtB.

A magnetic film is more preferably made of a ferromagnetic metal, the composition of the ferromagnetic metal being represented by the general formula:

$$(Co_x Cr_y Ge_z Pt_v)_{100-c'} T_{c'}$$

where x, y, z, v, and c', which represent the composition ratio, satisfy the relationships: $45 \leq x \leq 95.5$, $2.5 \leq y \leq 25$, $2 \leq z \leq 15$, $2 \leq v \leq 25$, and $1 \leq c' \leq 12$ (provided that x, y, z, v, and c' represent the composition ratio in terms of atomic %). In this composition, the composition ratio may satisfy the relationships: $78 \leq x \leq 95.5$, $2.5 \leq y \leq 25$, $2 \leq z \leq 15$, $2 \leq v \leq 25$, and $1 \leq c' \leq 12$.

In the above composition, c', which represents the composition ratio of B, is preferably 1 atomic % or more and 8 atomic % or less in the case that said T' is B, while c', which represents the composition ratio of Ta, is preferably 1 atomic % or more and 8 atomic % or less in the case that said T' is Ta. In the composition within the above range, c', which represents the composition ratio of B, is more preferably 2 atomic % or more and 8 atomic % or less in the case that said T' is B, while c', which represents the composition ratio of Ta, is more preferably 2 atomic % or more and 8 atomic % or less in the case that said T' is Ta.

More specific compositions include, for example, CoCrGePtTa, CoCrGePtB, and CoCrGePtTaB.

Increase of the Recording Density in Magnetic Recording Media

The magnetic recording medium 60 in the present invention is preferably a magnetic recording medium (longitudinal magnetic recording medium) capable of forming a recording magnetization parallel to the film surface of the ferromagnetic metal magnetic film 65 described above. In the case of such a magnetic recording medium, the size of the recording magnetization must be reduced to improve the recording density.

A reduction of the size of the recording magnetization decreases the leakage flux of each recording magnetization, to thereby decrease a regenerative signal output in the magnetic head. Accordingly, it is desired to further reduce the medium noise which is considered to be caused by the effect of adjacent recording magnetization.

Coercive Force of Ferromagnetic Metallic Layer: Hc, Magnetic Anisotropy Field: $H_k^{grain}$, Normalized Coercive Force: $Hc/H_k^{grain}$, and Magnetocrystalline Anisotropy: $K_u^{grain}$ As used herein, the term "coercive force of ferromagnetic metallic layer: Hc" refers to a coercive force of the magnetic recording medium which is determined from a magnetization curve measured by using a vibrating sample magnetometer (hereinafter abbreviated to "VSM").

As used herein, the term "magnetic anisotropy field: $H_k^{grain}$" refers to an applied magnetic field at which a rotation hysteresis loss measured by using a high-sensitivity torque magnetometer disappears completely. The coercive force and magnetic anisotropy field are values measured in the thin film surface in the case of the magnetic recording medium 60 of this embodiment wherein the ferromagnetic metal magnetic film 65 is formed on the surface of the substrate via the metallic underlayer 64.

According to the Stoner-Wohlfarth theory, it is shown that the normalized coercive force $Hc/H_k^{grain}$ becomes 0.5 in case grains are completely magnetically isolated. This value is an upper limit of the normalized coercive force.

In J. G. Zhu and H. N. Bertram, Journal of Applied Physics, VOL. 63, 1988, pp. 3248, it is described that a high normalized coercive force of the ferromagnetic metal magnetic film lowers the magnetic interaction between the crystals which constitute the ferromagnetic metal magnetic film, thus making it possible to realize a high coercive force.

As used herein, the term "normalized coercive force: $Hc/H_k^{grain}$" is a value obtained by dividing the coercive force Hc by the magnetic anisotropy field: $H_k^{grain}$ of grains, and the present inventors have previously published the fact that this value means the degree of the magnetic isolation of grains, in "Magnetization Reversal Mechanism Evaluated by Rotational Hysteresis Loss Analysis for Thin Film Media", Migaku TAKAHASHI, T. SHIMATSU, M. SUEKANE, M. MIYAMURA, K. YAMAGUCHI and H. TAKAHASHI, T. SHIMATSU, M. SUEKANAE, M. MIYAMURA, K. YAMAGUCHI and H. YAMASAKI: IEEE TRANSACTIONS ONMAGNETICS, VOL. 28, 1992, p.3285.

As used herein, the term "the magnetocrystalline anisotropy $K_u^{grain}$" in the present invention refers to the numerical value of a half of the product of the saturation grain magnetization (Ms) and magnetic anisotropy field $H_k^{grain}$, which is an indication capable of judging that a magnetic recording medium having a larger value of the magnetic anisotropy field $H_k^{grain}$ is a thermally stable magnetic recording medium because the thermal agitation is suppressed.

By the way, as described in the Prior Art, the present inventors have already reported (National Application PCT/JP97/01092) that a normalized coercive force of 0.35 or more can be obtained when a CoCrTa magnetic film is formed by using an ultra clean process and it is necessary to satisfy the relationship $4\pi Ms/H_k^{grain} \leq 1.0$, in order to attain the normalized coercive force.

To the contrary, the normalized coercive force of a CoCrTa ferromagnetic metal magnetic film made by a conventional sputtering method under general conditions exhibits a value smaller than 0.35 as far as the ferromagnetic metallic film is made of a Co-based alloy, and a value of $(4\pi Ms/H_k^{grain})$ was merely a numerical value which exceeds 1.

However, there can be produced a magnetic recording medium 60, which simultaneously provides a high normalized coercive force and thermally stable magnetic characteristics, by making a ferromagnetic metal magnetic film 65 from a ternary CoCrGe alloy with the composition described above or a CoCrGeT or CoCrGeT' alloy even in case of using a conventional method using no special clean atmosphere. As a matter of course, a magnetic recording medium 60 having excellent characteristics can be produced by forming a ferromagnetic metal magnetic film 65 with the composition described above using an ultra clean process provided by the present inventors.

An example of a method of producing such a ferromagnetic metal magnetic film 65 by using a sputtering method will be described below.

Sputtering Method

The sputtering method as an example of the method of producing a ferromagnetic metal magnetic film 65 of the present invention includes, for example, a carrier type sputtering method wherein a thin film is formed while a substrate 51 moves in front of a target, and a static type sputtering method wherein a thin film is formed in the state where a substrate 51 is fixed in front of a target.

The carrier type sputtering method of the former is advantageous for producing a low-cost magnetic recording medium because of its good mass-producibility, while the static type sputtering method of the former makes it possible to produce a magnetic recording medium having excellent recording/reproduction characteristics because the incidence angle of sputtering grains to the substrate 51 is stable. In the case of producing the magnetic recording medium 60 of the present invention, the method is not limited to any of the carrier type and static type methods.

As a film forming device suited for use in the case of producing a ferromagnetic metal magnetic film 65 by a sputtering method, a sputtering device having the structure shown in FIG. 5 be used as an example and this device will be described in the embodiments described hereinafter.

Application of Negative Bias to Substrate

As used herein, the term "application of a negative bias to a substrate" refers to application of a DC bias voltage to a substrate 51 in the case that an underlayer 64 of Cr and a ferromagnetic metal magnetic film 65 are formed as the magnetic recording medium.

When the ferromagnetic metal magnetic film 65 is formed while applying a proper bias voltage to the substrate 51, a coercive force of the magnetic recording medium can be enhanced. The effect of the bias application described above exerted in case of applying both layers tends to be larger than that in case of applying a bias only when any one of the films is made. However, the bias application described above often exerts an effect on objects in the vicinity of the substrate, i.e. the substrate supporting member and substrate holder. As a result, gases and dust generated in the atmosphere in the vicinity of the substrate are liable to cause a disadvantageous state where they are incorporated into the thin film during the formation of the film, thereby making various film properties unstable.

The application of a bias to the substrate also has the following problems.

(1) It is difficult to apply to a non-conductive substrate made of glass.

(2) The saturation magnetic flux density (Bs) of the formed magnetic metal magnetic film is likely to be lowered.

(3) It is necessary to provide the film forming chamber with a complicated mechanism section therein.

(4) The degree of the application of a bias to the substrate is liable to vary and, as a result, the magnetic characteristics of the resulting magnetic film are liable to large distribution.

Accordingly, a method capable of obtaining the various desired film properties without especially applying a bias is required, but a film may be formed by applying a bias, as a matter of course.

To the contrary, if the ferromagnetic metal magnetic film 65 is formed from a ternary alloy with the composition described above or a CoCrGeT alloy, there is the advantage that a magnetic recording medium, which simultaneously has a high normalized coercive force and thermally stable magnetic characteristics, is easily obtained without especially applying a negative bias to the substrate 51. Accordingly, the underlayer 64 and ferromagnetic metal magnetic film 65 can also be formed on the substrate 51 in a non-bias state without applying a negative bias on the substrate 51.

Ultimate Vacuum Degree in Case Metallic Underlayer and/or Ferromagnetic Metal Magnetic Film are Formed Heretofore, "ultimate vacuum degree at which a metallic underlayer and/or a ferromagnetic metal magnetic film" have been considered as a film forming factor which has an influence on a value of the coercive force depending on the material of the ferromagnetic metal magnetic film.

It has been considered that a low ultimate vacuum degree (e.g. on an order within a range from $10^{-6}$ to $10^{-7}$ Torr ($10^{-4}$ to $10^{-5}$ Pa) has a large effect especially in the case of a Co-based magnetic material containing Ta in a ferromagnetic metal magnetic film. If the ferromagnetic metal magnetic film is formed from a ternary CoCrGe alloy with the above composition, a magnetic recording medium, which simultaneously has a high normalized coercive force and thermally stable magnetic characteristics, can be produced even if a magnetic film is formed in a film forming chamber wherein the ultimate vacuum degree of the inside is in the order within a range from $10^{-6}$ to $10^{-7}$ Torr. As a matter of course, the ferromagnetic metal magnetic film 65 of this embodiment may be formed by the ultra clean process provided by the present inventors.

Surface Temperature of Substrate in the Case that Metallic Underlayer and/or Ferromagnetic Metal Magnetic Film are Formed As used herein, the term "surface temperature of a substrate in case a metallic underlayer and/or a ferromagnetic metal magnetic film are formed" is a film forming factor which has an effect on the value of the coercive force without depending on the material of ferromagnetic metal magnetic film.

As far as the substrate is not damaged, a higher coercive force can be realized by forming a film at a higher surface temperature. Damage to the substrate refers to external changes such as warping, swelling and cracking, and internal changes such as generation of magnetization and an increase of the amount of gas evolved. However, any heat treatment must be generally conducted in a film forming chamber or a preliminary chamber thereof so as to attain a high surface temperature of the substrate. This heat treatment has the disadvantage that gases and dust generated in the space in the vicinity of the substrate are incorporated into the thin film during the formation of the film, thereby making various film properties unstable.

A high surface temperature of the substrate also has the following problems.

(1) A non-magnetic NiP layer in a NiP/Al substrate is magnetized.

(2) Strain is produced in a substrate.

(3) It is difficult for the substrate having a low thermal conductivity, such as a substrate made of glass, to increase or maintain its substrate temperature. Accordingly, there is demand for a method capable of obtaining various desired film properties even if the above heat treatment is not conducted or a heat treatment at low temperatures is conducted.

Surface Roughness of Substrate, Ra

The surface roughness of the substrate in the present invention includes, for example, the arithmetical mean deviation of profile (Ra) determined in the case that the surface of a disk-shaped substrate is measured.

As a measuring device for the surface roughness Ra, for example, TALYSTEP manufactured by RANKTAYLOR-HOSBSON Co. can be employed.

In case the substrate starts to rotate while in a stopped state, or stops while in a rotating state, the surface of the magnetic recording medium and that of the magnetic head will contact each other and will slide (CSS operation). Since the surface roughness Ra is larger, it is easier suppress stiction of the magnetic head and increase of the coefficient of friction. On the other hand, when the substrate has reached a maximum rotating speed, the distance between the magnetic recording medium and magnetic head, i.e. the levitation height of the magnetic head, must be reduced to as small a value as possible. Therefore, the smaller the value of Ra, the better. Accordingly, a maximum value and a minimum value of the surface roughness of the substrate are appropriately determined based on the factors described above and the specification, required by the magnetic recording medium.

For example, if the levitation height of the magnetic head is 24 μ inches, Ra is within a range from 6 to 8 nm. However, the levitation height (distance between the magnetic head and the surface of the magnetic head recording medium for a recording/reproduction operation) of the magnetic head must be more reduced so as to further increase the recording density. It is important to make the surface of the magnetic recording medium flatter so as to meet this requirement. For this reason, a substrate having a small surface roughness Ra is preferable. Accordingly, even when the substrate has a smaller surface roughness, a method capable of obtaining the various desired film properties may be appropriately employed. For example, Ra is reduced to 1.5 nm or less after forming a texture on a structure comprising an Al substrate and a Ni—P layer formed on the Al substrate, and the Ra of the NiP/Al substrate subjected to a special polishing treatment can also be adjusted within a range from 0.5 to 0.7 nm.

Texturing Treatment

The texturing treatment to which the substrate in the present invention is conducted by, for example, using a mechanical polishing method, a chemical etching method, and a method of physically forming an uneven film. In the case of an aluminum alloy substrate, which is most widely used as the substrate of the magnetic recording medium, the method of mechanical polishing is employed.

For example, there is a method of concentrically forming slight scratches on an (Ni—P) film formed on the surface of an aluminum alloy substrate by pressing a tape, wherein abrasive grains are adhered on the surface, against the surface of the rotating substrate. In this method, abrasive grains are sometimes used in the state of being separated from the tape.

For the reasons described under the heading "Surface roughness of substrate", a method capable of obtaining various desired film properties may be appropriately employed even if the above texturing treatment is not conducted or texture with smaller roughness is formed.

Target

As the target used to produce the ferromagnetic metal magnetic film 65 with the composition described above, for example, there can be used a composite target wherein Cr chips and Ge chips, which have a desired size, are placed on a Co target in the composition ratio described above. It is also possible to use a sintered target made by forming Co, Cr and Ge into granules, mixing the granules in the composition ratio described above, and sintering the mixture.

It is also possible to use an alloy target with the composition described below, which is made by alloying Co, Cr and Ge.

There can be used a target made of an alloy consisting essentially of cobalt (Co), chromium (Cr), and germanium (Ge), the composition of the alloy being represented by the general formula:

$Co_xCr_yGe_z$ where x, y, z, and c, which represent the composition ratio, satisfy the relationships: $78 \leq x \leq 95.5$, $2.5 \leq y \leq 25$, $2 \leq z \leq 15$, and $x+y+z=100$ (provided that x, y, and z represent the composition ratio in terms of atomic %).

In the alloy target, the composition ratio more preferably satisfies the relationships: $82 \leq x \leq 87$, $2.5 \leq y \leq 14.5$, and $2.5 \leq z \leq 14$.

It is also possible to use a target made of an alloy consisting essentially of cobalt (Co), chromium (Cr), germanium (Ge), and an element T (T represents one or more of the elements of Ta, Pt, Ni, Si, and B), the composition of the alloy being represented by the general formula:

$Co_xCr_yGe_zT_c$ where x, y, z, and c, which represent the composition ratio, satisfy the relationships: $60 \leq x \leq 95.5$, $2.5 \leq y \leq 25$, $2 \leq z \leq 15$, $c \leq 5$, and $x+y+z=100$ (provided that x, y, z, and c represent the composition ratio in terms of atomic %). In the composition with the above range, the composition ratio preferably satisfies the relationships: $78 \leq x \leq 95.5$, $2.5 \leq y \leq 25$, $2 \leq z \leq 1$, and $c \leq 5$.

More specific compositions include, for example, CoCrGeTa, CoCrGePt, CoCrGeB, CoCrGeTaPt, CoCrGeTaB, and CoCrGeTaPtB.

A magnetic film is preferably made of a ferromagnetic metal alloy, a composition of the ferromagnetic metal alloy being represented by the general formula:

$$(Co_xCr_yGe_zPt_v)_{100-c'}T'_{c'}$$

where x, y, z, v, and c', which represent the composition ratio, satisfy the relationships: $45 \leq x \leq 95.5$, $2.5 \leq y \leq 25$, $2 \leq z \leq 15$, $2 \leq v \leq 25$, and $1 \leq c' \leq 12$ (provided that x, y, z, v, and c' represent the composition ratio in terms of atomic %). In the composition within the above range, the composition ratio may preferably satisfy the relationships: $78 \leq x \leq 95.5$, $2.5 \leq y \leq 25$, $2 \leq z \leq 15$, $2 \leq v \leq 25$, and $2 \leq c' 12$.

In the above composition, c', which represents the composition ratio of B, is preferably 1 atomic % or more and 8 atomic % or less if the element T' is B, while c', which represents the composition ratio of Ta, is preferably 1 atomic% or more and 8 atomic % or less of the element T' is Ta. In the composition within the above range, c', which represents the composition ratio of B, is more preferably 2 atomic % or more and 8 atomic % or less of the element T' is B, while c', which represents the composition ratio of Ta, is more preferably 2 atomic % or more and 8 atomic % or less if the element T' is Ta.

Among these ranges, B is more preferably within a range from 1 atomic % to 5 atomic % in case the element T' is B. More specific compositions include, for example, CoCrGePtTa, CoCrGePtB, and CoCrGePtTaB.

The alloy with such a composition or a magnetic film thereof can exhibit the same characteristics as those of the ferromagnetic metal magnetic film 65 described above. That is, reduction of the intergranular interaction makes it possible to simultaneously realize a high normalized coercive force of 0.35 or more and to satisfy the relationship $(4\pi Ms/H_k^{grain}) \leq 1.0$. In addition to reconciliation of these characteristics, it also becomes possible to obtain a high magnetic anisotropy field $(H_k^{grain})$ and to simultaneously control the grain size of the magnetic grains to 10 nm or less.

These alloys can be used as the target for forming a magnetic film in place of the composite target described above. These alloys can be obtained by mixing raw powders or ingots in the above composition ratio and melting the mixture using a technology such as arc melting. These alloy targets can also be obtained in the same manner as described above, using a technology such as arc melting.

A magnetic film with the desired composition, which has the characteristics described above, can be formed on a desired base (base material) by sputtering these alloy target onto the base after mounting in a sputtering device.

As a matter of course, a ferromagnetic metal magnetic film with the composition described above may be formed by applying other film forming means such as laser deposition and ion beam film forming, in addition to the sputtering method, using these alloy targets as a material source.

Embodiments

The following embodiments further illustrate the present invention in detail, but the present invention is not limited by these embodiments.

In this embodiment, ferromagnetic metal magnetic films made of CoCrGe having different compositions were formed on a substrate via a metallic underlayer made of a Cr film by using a sputtering method. In that case, the composition of the film to be formed was changed by sputtering after placing a predetermined number of Cr chips and Ge chips, which have a predetermined size, on a Co target. The ultimate vacuum degree of a chamber, in which the ferromagnetic metal magnetic film is formed, was fixed to the order of $10^{-7}$ Torr ($10^{-5}$ Pa) and no bias was applied to the substrate when the metallic underlayer of Cr and ferromagnetic metal magnetic film are formed.

In this embodiment, a film was made by using a composite target comprising Cr chips and Ge chips placed on a Co target, however, a sputtering method using a mixed target made by mixing Co, Cr and Ge, or using separately a Co target, a Cr target and a Ge target, or the other film forming method such as laser deposition method or ion beam film forming method may be used, as a matter of course.

Figure 5:
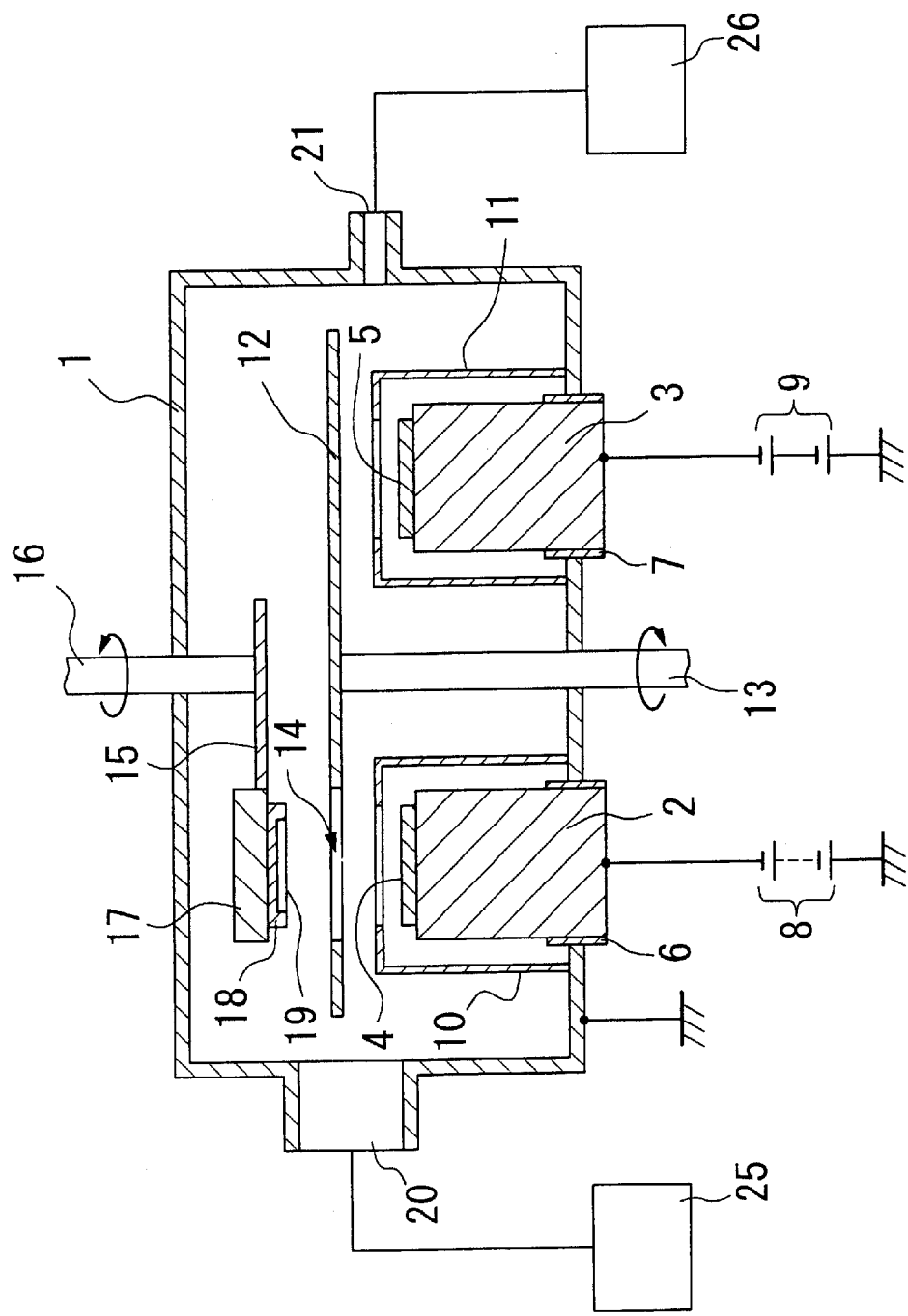
FIG. 5 is a schematic cross-sectional view showing a DC magnetron sputtering device used in the production of samples of magnetic recording media of the embodiments.

FIG. 5 is a schematic cross-sectional view showing a DC magnetron sputtering device used in the production of media in this embodiment.

In the device shown in FIG. 5, 1 denotes a film forming chamber, 2 denotes a cathode for forming a metallic underlayer disposed at one side of the bottom of the film forming chamber 1, 3 denotes a cathode for forming a ferromagnetic metal layer disposed at the other side of the bottom of the film forming chamber 1, 4 denotes a first target made of Cr for forming a metallic underlayer disposed on the cathode 2, 5 denotes a second target made of Co for forming a metallic underlayer disposed on the cathode 3, Cr chips and Ge chips being placed on the second target, 6 and 7 denote insulating members for each cathode, 8 and 9 denote DC power sources connected with the respective cathodes, 10 and 11 denote earth shields for each cathode, 12 denotes a shutter, 13 denotes a rotating means of the shutter, 14 denotes an aperture of the shutter, 15 denotes a substrate holder supporting means, 16 denotes a rotating means of the substrate holder supporting means, 17 denotes a heating means, 18 denotes a holder, 19 denotes a substrate, 20 denotes an exhaust port, and 21 denotes a gas inlet port.

In the device shown in FIG. 5, a film forming chamber 1 is connected with a pumping means 25 of an evacuating means through an exhaust port 20, thereby making it possible to pump out the inside of the film forming chamber 1 to a desired degree of vacuum, degree. Furthermore, the film forming chamber 1 is connected with a gas supply source 26 via a gas inlet port 21, thereby making it possible to supply a gas such as Ar gas or nitrogen gas into the film forming chamber 1, the inside of which has been pumped out.

In the device shown in FIG. 5, a rotating means 13 of a shutter is disposed to vertically pierce the center of the bottom of the film forming chamber 1 and is composed of a rotating axis which supports the center of a shutter 12, while a rotating means 16 of a substrate holder supporting member is disposed to vertically pierce the center of the top of the film forming chamber 1 and is composed of a rotating axis which supports the end of a supporting member 15 of a substrate holder. The shutter 12 is capable of making an aperture 14 face towards a first target 4 on a cathode 1 or towards a second target 5 on a cathode 3 by an operation of the rotating means 13 of the shutter, and is also capable of making a substrate 19 toward the first target 4 on the cathode 1 or facing it toward the second target 5 on the cathode 3 by the rotating means 16 of the substrate holder supporting means.

The conditions for producing the magnetic recording medium of this embodiment are shown in Table 1.

TABLE 1

| Film forming method | DC magnetron sputtering method |
|---|---|
| Substrate material | Glass |
| Substrate shape | 8 mm square |
| Substrate surface condition | No texture, Ra < 1 nm |
| Ultimate vacuum degree in film forming chamber | $5 \times 10^{-6}$ Torr ($665 \times 10^{-6}$ Pa) |
| Process gas | Ar gas |
| Impurity concentration in Ar gas | 110 ppb or less |
| Ar gas pressure | 10 mTorr (13.3 Pa) |
| Holding temperature of substrate surface | 250° C. |
| Target material | Cr, Co + (Cr,Ce) chips |
| Target diameter | 4 inches |
| Purity of target material | 3N (Cr), 3N (CoCrGe) |
| Distance between target and substrate | 50 mm |
| Power imparted to target | DC 200 W (Cr, CoCrGe) |
| Bias voltage to substrate | Not applied |
| Thickness of film formed | 100 nm (Cr), 30 nm (CoCrGe) |

The method of producing the magnetic recording medium according to this embodiment will be described below in the sequence indicated by parenthesized numbers.

(1) After setting a substrate 19, which had been subjected to a predetermined cleaning process, onto a substrate holder 18 installed in the film forming chamber, the inside of the film forming chamber 1 was pumped out to a vacuum degree of $5 \times 10^{-6}$ Torr through an exhaust port 20 by a pumping means 25. The substrate 18 was disposed above the target 4. The film forming chamber 1 was kept at the ground potential.

(2) The substrate 19 was heated via the substrate holder 18 with heating means 17, to keep the surface temperature of the substrate 19 at 250° C.

(3) Ar gas was introduced through a gas inlet port 21 into the film forming chamber 1 and the gas pressure was controlled to 10 mTorr by means of a mass flow controller (not shown).

(4) Predetermined levels of DC power were supplied from a DC power source 8 to a cathode 2 and from a DC power source 9 to a cathode 3, and preliminary sputtering was applied to the target 4 for several minutes. A shutter 12 was used to mask the targets 4, 5 from the substrate 19.

(5) The shutter 12 was moved by using rotating means 13 so that an aperture 14 of the shutter 12 was located right above the target 4 (the arrangement shown in FIG. 5).

Then the shutter 12 was operated to open or close thereby to form a metallic underlayer made of Cr film 100 nm in thickness on the substrate 19.

(6) After forming the metallic underlayer, the substrate 18 was moved by using rotating means 16 so that the substrate holder 18 was located right above the target 5. At this time, the shutter 12 was disposed to block the sight of the target 5 from the side of the substrate 19 (the shutter arrangement shown in FIG. 5).

(7) The shutter 12 was moved by using the rotating means 13 so that the aperture 14 of the shutter 12 was located right above the target 5. Then the shutter 12 was operated to open or close thereby to form a ferromagnetic metal magnetic film made of CoCrGe alloy 30 nm in thick on the Cr film. The composition of the CoCrGe magnetic film was controlled by adjusting the number of Cr chips and Ge chips placed on the Co target.

(8) After forming the ferromagnetic metal magnetic film, the DC power levels applied to the cathodes 2, 3 were reduced to zero, thereby to stop the discharge.

(9) The introduction of the gas into the film forming chamber 1 was stopped and the substrate temperature was decreased.

(10) A nitrogen gas was introduced into the film forming chamber 1 and, after the inner pressure of the film forming chamber 1 reached the atmospheric pressure, the produced sample was removed from the film forming chamber 1. Samples made in the process described above having different compositions of a CoCrGe film were tested to measure the magnetic characteristics thereof by using a vibrating sample magnetometer (VSM) and a high-sensitivity torque magnetometer.

Figure 2:
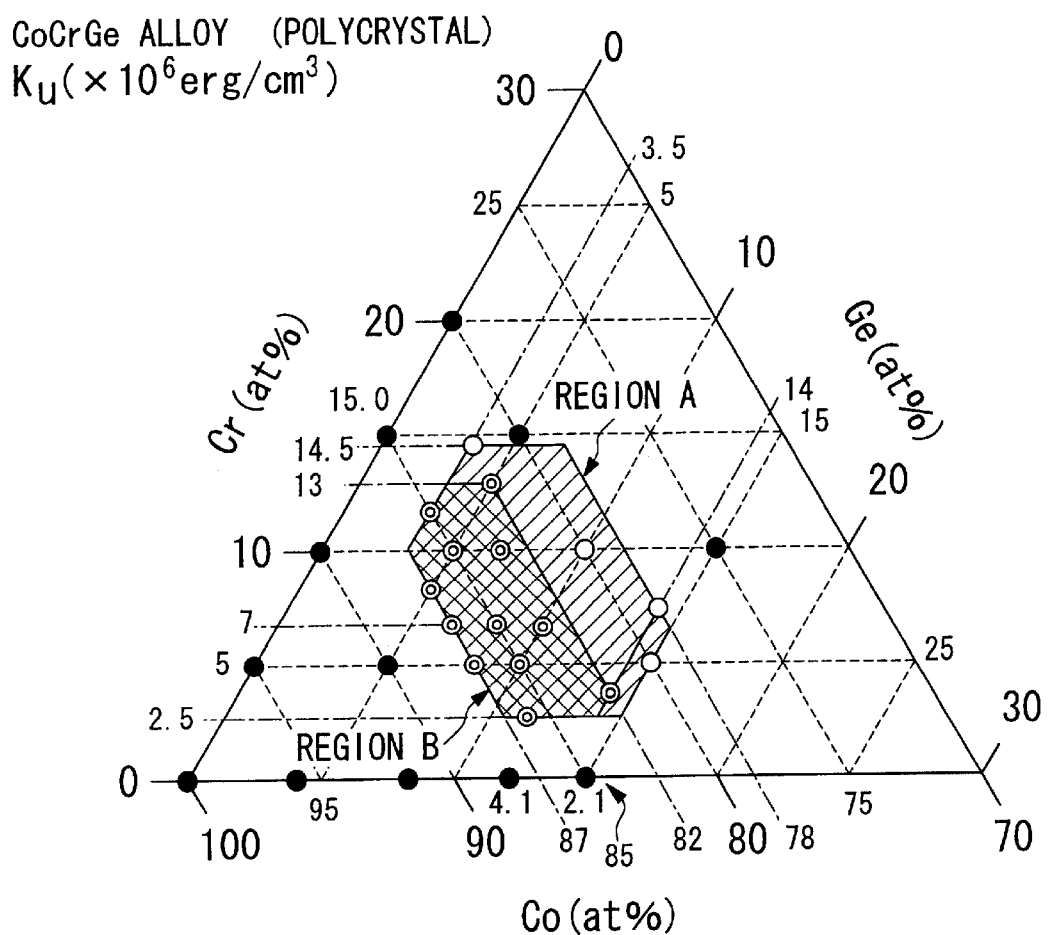
FIG. 2 is a triangular composition diagram showing a composition region A where both the characteristics of the relationship $4\pi Ms/H_k^{grain} \leq 1.0$ and the characteristics of the relationship $K_u^{grain} \leq 1.5 \times 10^6$ erg are obtained and a composition region B where both the characteristics of the relationship $4\pi Ms/H_k^{grain} \leq 1.0$ and the characteristics of the relationship $K_u^{grain} \geq 2.0 \times 10^6$/cm$^3$ erg are obtained in the respective samples obtained in the embodiments.
Figure 3:
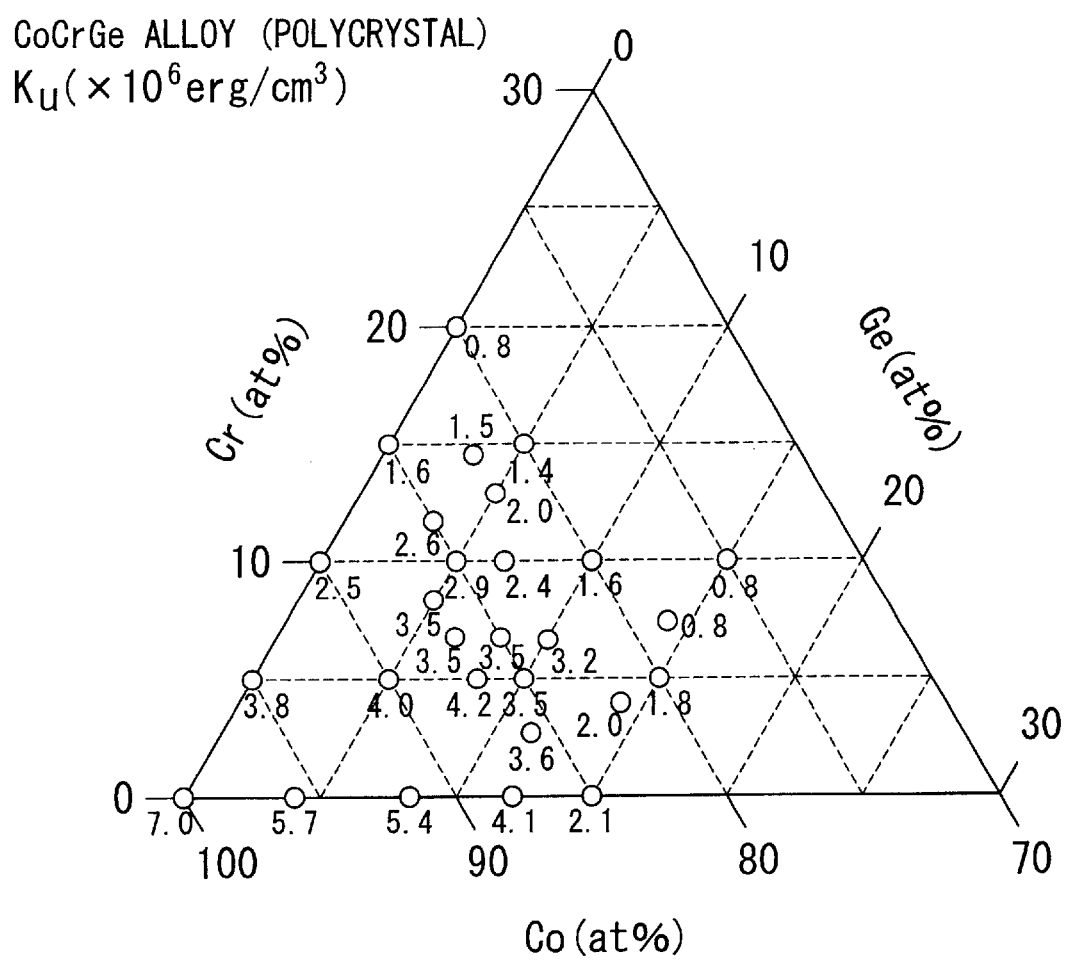
FIG. 3 is a graph showing the composition dependence of the magnetocrystalline anisotropy $K_u^{grain}$ in the respective samples obtained in the embodiments.
Figure 4:
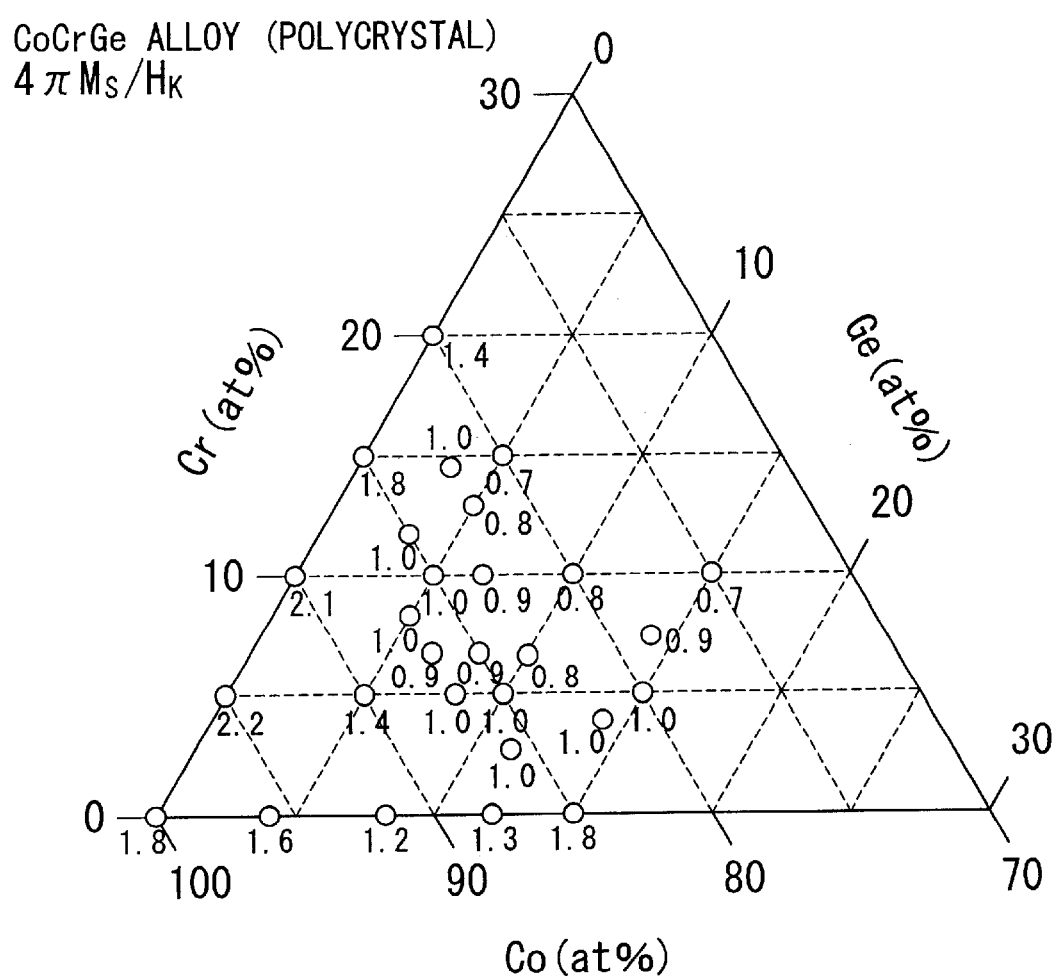
FIG. 4 is a graph showing the composition dependence of $4\pi Ms/H_k^{grain}$ in the respective samples obtained in the embodiments.

FIG. 2 is a triangular composition diagram showing composition ratios of the resulting respective samples, FIG. 3 is a triangular composition diagram showing the values of the magnetocrystalline anisotropy ($K_u^{grain}$) of the resulting respective samples, and FIG. 4 is a triangular composition diagram showing the value of ($4\pi Ms/H_k^{grain}$). FIG. 2 is a triangular composition diagram made based on the measurement results of FIG. 3 and FIG. 4.

Samples which satisfy the relationships: $4\pi Ms/H_k^{grain} \leq 1.0$ and $(K_u^{grain}) \geq 1.5 \times 10^6$ erg/cm$^3$ are shown by the symbol ○ and samples which satisfy the relationships: $4\pi Ms/H_k^{grain} \leq 1.0$ and $(K_u^{grain}) \geq 2 \times 10^6$ erg/cm$^3$ are shown by the symbol ⊙, and other samples are shown by the symbol ●.

Examples of the composition ratio of the samples shown by the symbol ○ are $Co_{78}Cr_8Ge_{14}$, $Co_{80}Cr_{5Ge15}$, $Co_{80}Cr_{10}Ge_{10}$, and $Co_{82}Cr_{14.5}Ge_{3.5}$.

Examples of the composition ratio of the samples shown by the symbol ⊙ are $Co_{82}Cr_{13}Ge_5$, $Co_{82}Cr_4Ge_{14}$, $Co_{83}Cr_{10}Ge_7$, $Co_{83}Cr_7Ge_{10}$, $Co_{85}Cr_{11.5}Ge_{3.5}$, $Co_{85}Cr_{10}Ge_5$, $Co_{85}Cr_7Ge_8$, $Co_{85}Cr_5Ge_{10}$, $Co_{87}Cr_8Ge_6$, $Co_{87}Cr_7Ge_5$, $Co_{87}Cr_5Ge_8$, and $Co_{86}Cr_{2.5}Ge_{11.5}$.

The following points were made clear by the measurement results shown in FIG. 2 to FIG. 4.

1. When using a CoCrGe alloy magnetic film, which constitutes a ferromagnetic metal magnetic film, the composition of the alloy being represented by the general formula

where x, y and z satisfy the relationships: $78 \leq x \leq 87$, $2.5 \leq y \leq 14.5$, $3.5 \leq z \leq 15$, and $x+y+z=100$ (provided that x, y, and z represent the composition ratio in terms of atomic %) (the region shown by the oblique line in FIG. 2), it is made possible to satisfy the relationship $4\pi Ms/H_k^{grain} \leq 1.0$, which is the condition required to obtain a high normalized coercive force ($Hc/H_k^{grain}$) of 0.35 or more without depending on the grain size of the ferromagnetic metal magnetic film and to obtain a magnetocrystalline anisotropy ($K_u^{grain}$) of $1.5 \times 10^6$ erg/cm$^3$ or more, thus making it possible to form a magnetic recording medium which also has thermally stable magnetic characteristics in a film forming space, an ultimate vacuum degree of which is on the order of $10^{-6}$ Torr.

2. When using a magnetic film made of an alloy, the composition of which is represented by the general formula

where x, y and z satisfy the relationships: $82 \leq x \leq 87$, $2.5 \leq y \leq 13$, $3.5 \leq z \leq 14$, and $x+y+z=100$ (provided that x, y, and z represent the composition ratio in terms of atomic %) (the region shown by crosshatching in FIG. 2), it is possible to form a ferromagnetic metal magnetic film having a magmetocrysatllline anisotropy ($K_{ugrain}$) of $2.0 \times 10^6$ erg/cm$^3$ or more, which has never been reported in a conventional Co-based material, thus making it possible to form a magnetic recording medium which has notably excellent thermally stable magnetic characteristics.

When using a magnetic film made of an alloy, the composition of which is represented by the general formula

$Co_xCr_yGe_z$, where x, y, and z satisfy the relationships: $84 \leq x \leq 87$, $2.5 \leq y \leq 8$, $5 \leq z \leq 12$, and $x+y+z=100$ (provided that x, y and z represent the composition ratio in terms of atomic %), it is possible to form a ferromagnetic metal magnetic film having a more excellent magnetocrystalline anisotropy ($K_{ugrain}$) of $3.0 \times 10^6$ erg/cm$^3$ or more, thus making it possible to form a magnetic recording medium which has notably excellent thermally stable magnetic characteristics.

As is apparent from the results 1 and 2, it is possible to produce a magnetic film capable of providing excellent magnetic characteristics, which have never been obtained in a conventional magnetic material, under general sputtering film forming conditions without using a special ultra clean process with regard to a magnetic recording medium comprising a ternary CoCrGe film with the composition described above as the ferromagnetic metal magnetic film.

When using a CoCrGe ferromagnetic metal magnetic film capable of providing excellent magnetic characteristics as described above under general sputtering film forming conditions, it can be expected to obtain more excellent magnetic characteristics by production using the ultra clean process provided previously by the present inventors.

Alloy samples with the above composition of CoCrGe were prepared by melting and the value (kOe) of the magnetic anisotropy field: $H_k^{grain}$ of each was measured. The results are listed below.

Method of Preparing Alloy Samples

Samples were prepared by cutting a material which was formed by evacuating to $8 \times 10^{-6}$ Torr ($1064 \times 10^{-6}$ Pa), followed by arc melting in an Ar atmosphere into a disk-shaped plate of about 0.6 mm$\phi$ in thickness, subjecting the disk plate to a solid solution treatment at 10000° C. for one hour, and repeating a transformation treatment (T$\alpha \rightarrow \epsilon$° C., 10 hours) until the $\alpha$ phase was converted to the $\epsilon$ (hcp) phase. XRD was used in the structural analysis and VSM was used in the measurement of Ms and, furthermore, the VSM-SPD method was used in the measurement of $H_k$.

As used herein, "SPD" (Singular Point Detection) refers to a method which is known as a method of determining the magnetic anisotropy field by utilizing the fact that second order differential $d^2M/dH^2$ of the magnetization M in the hard-axis has a singularity point in the magnetic anisotropy field $H_k$ in a magnetic material having a positive uniaxial magnetocrystalline anisotropy. In the present invention, a measuring method of applying the SPD method to a magnetization curve measured by using the VSM (VSM-SPD method) was used. Also in the measurement of magnetic characteristics of the above ferromagnetic metal magnetic film, the magnetic anisotropy field Hk was measured in the same manner.

The composition and value (kOe) of magnetic anisotropy field: $H_k^{grain}$ of the resulting respective alloy samples are listed below.

$Co_{80}Cr_5Ge_{15}$ (6.7 kOe), $Co_{80}Cr_{10}Ge_{10}$ (7.3 kOe), $Co_{87}Cr_{11.5}Ge_{3.5}$ (8.0 kOe), $Co_{83}Cr_7Ge_{10}$ (10.3 kOe), $Co_{85}Cr_{10}Ge_5$ (8.5 kOe), $Co_{85}Cr_7Ge_8$ (9.8 kOe), $Co_{85}Cr_5Ge_{10}$ (9.5 kOe), $Co_{87}Cr_8Ge_5$ (9.1 kOe), $Co_{87}Cr_7Ge_6$ (9.8 kOe), $Co_{87}Cr_5Ge_8$ (10.4 kOe), and $Co_{85}Cr_{2.5}Ge_{11.5}$ (9.5 kOe).

These CoCrGe alloy samples exhibited a very high value of 8.0 kOe or more as a value (kOe) of magnetic anisotropy field: $H_k^{grain}$ when the amount of Cr is within a range from 0 to 11.5 atomic % and the amount of Cr is within a range from 3.5 to 14 atomic %.

Figure 6:
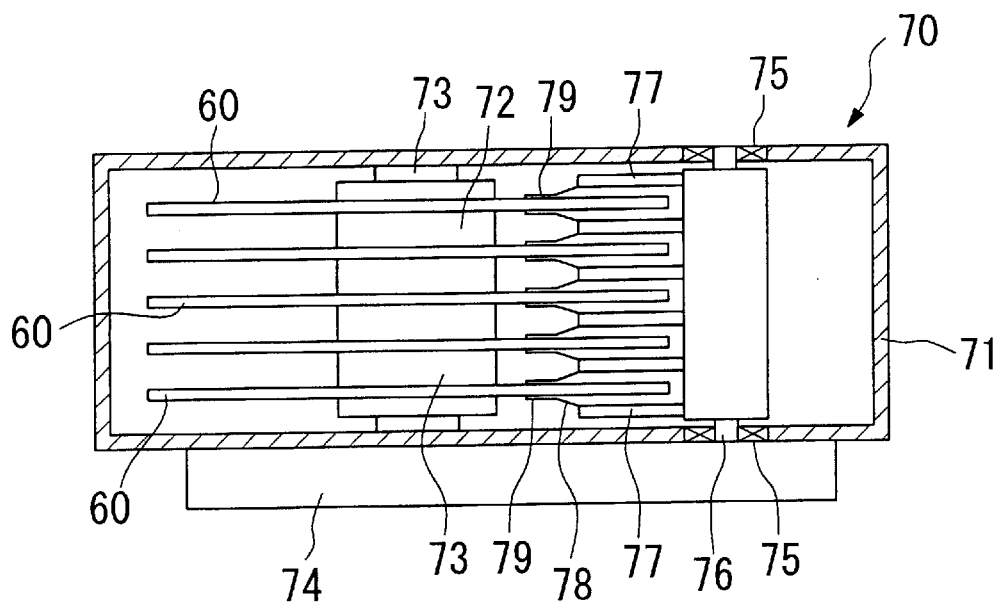
FIG. 6 is a side cross-sectional view showing an example of a magnetic recording device according to the present invention.

FIG. 6 shows an example of a HDD (hard disk drive) device (magnetic recording device) of a computer incorporated with the magnetic recording device 60 described previously.

Figure 7:
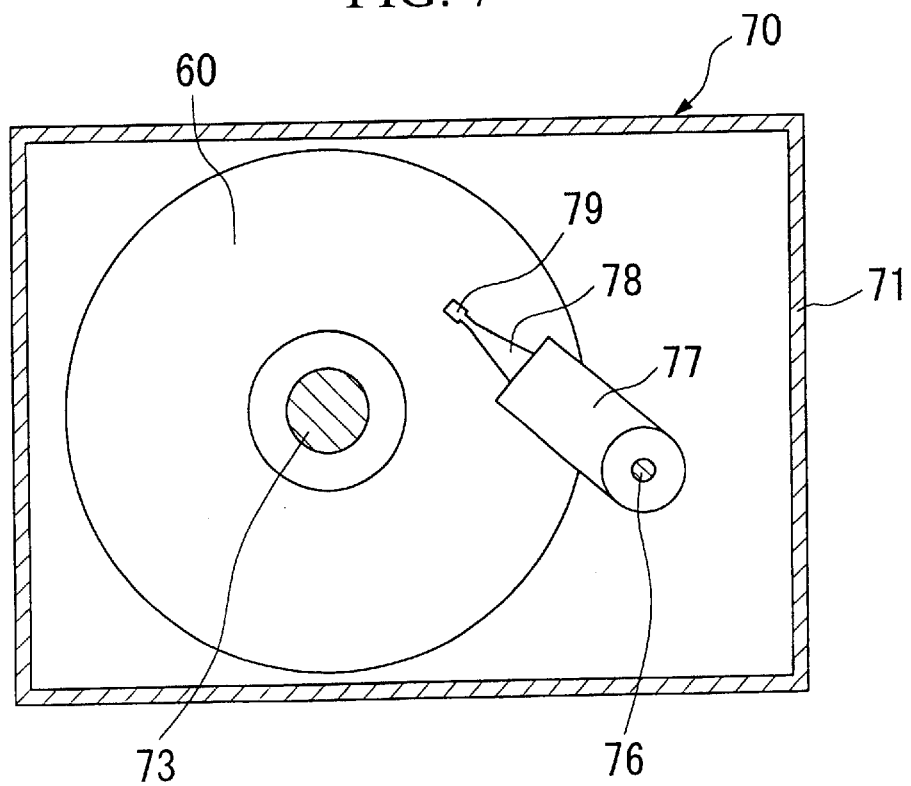
FIG. 7 is a planar cross-sectional view showing an example of the magnetic recording device shown in FIG. 6.

In a magnetic recording device 70 of this example, plural (five in the example shown in FIG. 7) magnetic recording media 60 are disposed in a chamber type casing 71 in the state of being inserted into a spindle 73 alternatively with a spacer 72. A bearing of the spindle 73 is also disposed in the casing 70 and a motor 74 for rotating the spindle is disposed outside the casing 71, thereby to enable the respective recording media 60 to freely rotate about the spindle 73.

A rotation axis 76 supported parallel to the spindle 73 by a bearing 75 is disposed at the side of the magnetic recording medium 60 in the casing 71. Plural arms 77 are attached to the rotation axis 76 to extend at the magnetic recording medium side and a magnetic head 79 is attached to a tip side of each swing arm 77 via a triangular plate-shaped load arm.

The magnetic head 79 is composed of a thin film type magnetic head, or a MIG type magnetic head, or a dual type magnetic head element obtained by integrating a MIG type magnetic head element with a read-only magnetoresistive type magnetic element, and a slider, and this slider is elastically supported by a gimbal member disposed at the tip side of the load arm. The magnetic head 79 moves to an arbitrary position on the magnetic recording medium 60 with the movement of the swing arm 77.

In the magnetic recording device 70 with the above construction, desired magnetic information can be written in the magnetic recording medium 60 by rotating the magnetic recording medium 60, moving the swing arm 77 and moving the magnetic head 79 to an arbitrary position on the magnetic recording medium 60, thereby to apply magnetization generated by the magnetic head 79 to the ferromagnetic metal magnetic film (magnetic recording layer) 65 formed on the magnetic recording medium 60. Also the magnetic information can be read by moving the swing arm 77 and moving the magnetic head 79 to an arbitrary position on the magnetic recording medium 60, thereby to detect leakage magnetic field from the ferromagnetic metal magnetic film (magnetic recording layer) 65 of the magnetic recording medium 60.

If the ferromagnetic metal magnetic film (magnetic recording layer) 65 has excellent magnetocrystalline anisotropy as described above in the case of reading and writing magnetic information, thermal agitation of the ferromagnetic metal magnetic film 65 can be suppressed. Therefore, the magnetic characteristics of the ferromagnetic metal magnetic film 65 do not deteriorate even if the inside of the magnetic recording device 70 is exposed to the eat of a motor 74, for example, and the magnetic recording device is used while being heated to a high temperature which exceeds 100° C. That is, there can be provided a magnetic recording device 70 having excellent recording/reproduction characteristics, which do not undergo deterioration of magnetic recording/reproduction characteristics of the ferromagnetic metal magnetic film 65 even if the magnetic recording device is used over a long period and heated for a long time.

When using a ferromagnetic metal magnetic film 65 having a high coercive force, the leakage magnetic field applied to the reading element of the magnetic head during the running while magnetically levitating the magnetic head can be enhanced. Therefore, a strong signal can be received, thereby making it possible to obtain recording/reproduction characteristics having a good SN ratio.

The magnetic recording device 70 described previously with reference to FIG. 6 and FIG. 7 shows an example of the magnetic recording device and, therefore, the number of magnetic recording media disposed in the magnetic recording device may be an arbitrary number of one or more, and an arbitrary number of magnetic heads 79 may be provide, as far as the number is one or more. The configuration and driving system of the swing arm 77 are not limited to those shown in the drawings and, as a matter of course, a linear driving system and other systems may also be used.

The results of the measurement of the magnetic characteristics of the ferromagnetic metal magnetic film with other compositions according to the present invention will be described below.

Figure 8:
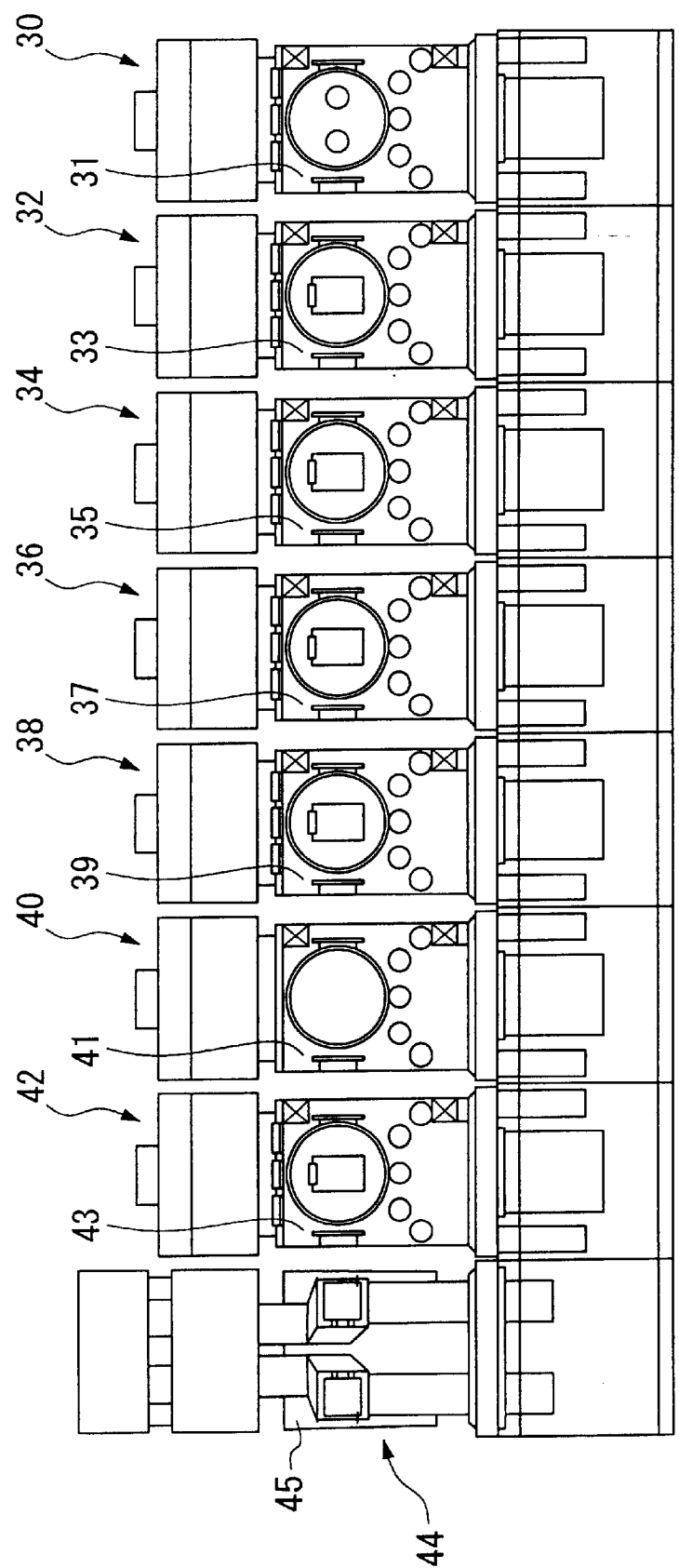
FIG. 8 is a front view showing a schematic configuration of a sputtering device used to produce the magnetic recording medium samples of the other embodiments.

A schematic configuration of the device used to produce the ferromagnetic metal magnetic film for measurement of magnetic characteristics in this embodiment is shown in FIG. 8.

The device shown in FIG. 8 is composed of several of vacuum chambers arranged in a row, in which the reference numeral 30 denotes a first chamber wherein a heater and an etching device are installed in a vertical vacuum chamber 31, the reference numeral 32 denotes a second chamber equipped with a sputtering film forming device, a heating device, and a vacuum chamber 33 with an evacuating device, the reference numeral 34 denotes a third chamber equipped with a sputtering film forming device, a heating device, and a vacuum chamber 35 with an evacuating device, the reference numeral 36 denotes a fourth chamber equipped with a sputtering film forming device, a heating device and a vacuum chamber 37 with an evacuating device, the reference numeral 38 denotes a fifth chamber equipped with a sputtering film forming device, a heating device and a vacuum chamber 39 with an evacuating device, the reference numeral 40 denotes a sixth chamber equipped with a RHEED (reflection high energy electron diffraction) analyzer and a vacuum chamber with an evacuating device, the reference numeral 42 denotes a seventh chamber equipped with a sputtering film forming device and a vacuum chamber 41 with an evacuating device, and the reference numeral 44 denotes an eighth chamber equipped with a robot arm and a vacuum chamber 45 with an evacuating device, respectively.

These respective chambers 30, 32, 34, 36, 38, 40, 42, and 44, which are adjacent to each other, are connected through a duct D equipped with a gate valve, thereby making it possible to perform an etching or film forming treatment in the state where the respective chambers are separately partitioned in a vacuum degree of $3 \times 10^{-9}$ Torr ($400 \times 10^{-9}$ Pa) or a ultra-high vacuum degree within a range from $1 \times 10^{-9}$ to $1 \times 10^{-11}$ Torr ($133 \times 10^{-9}$ to $133 \times 10^{-11}$ Pa). Gases supply mechanism is connected with each of these chambers 30, 32, 34, 36, 38, 40, and 42, thereby making it possible to optionally introduce the inside of each chamber by a sputtering gas such as an Ar gas.

Magnetic coupling type substrate carrier mechanisms are installed to carry the substrate by passing through the duct D and the inside of the chambers 30, 32, 34, 36, 38, 40, 42, and 44, thereby making it possible to carry the substrate in the sequence of the chambers 30, 32, 34, 36, 38, 40, 42, and 44 and to remove the substrate after treating in the chamber 42 using the robot arm disposed in the chamber 44. Preliminary heating and etching treatments can be conducted in the chamber 30 and a requisite film can be formed in the chambers 32, 34, 36, and 38 and, furthermore, the resulting film can be analyzed in the chamber 40 and a carbon-based protective film can be formed in the chamber 42.

The device shown in FIG. 8 is a device which can carry out the ultra clean process suggested previously by the present inventors. That is, it is a device which can control the ultimate vacuum degree within a range from $3 \times 10^{-9}$ to $3 \times 10^{-10}$ Torr ($400 \times 10^{-9}$ to $400 \times 10^{-10}$ Pa) and supply an ultra clean gas (Ar gas containing about 1 ppb of impurities such as $H_2O$), as an atmospheric gas with which the inside of the vacuum chamber is introduced, to each chamber.

Using the device shown in FIG. 8, an Al substrate coated with Ni—P (non-magnetic layer 63) is treated in each chamber while moving the substrate in order along the chambers 30 to 44.

First, in the first chamber 30, the substrate was heated up to 250° C. using an infrared lamp heater. Then, the surface of the substrate was dry-etched (14.4 mTorr/100 W/5 seconds) to clean the substrate surface.

A metallic underlayer 64 made of any one of a Cr film (5 nm in thickness)/$CrMo_{10}$ film (10 nm in thickness) and Cr film (5 nm in thickness)/$CrMo_{20}$ film (10 nm in thickness) was then formed on the surface of the substrate (the substrate was only passed through the chamber if any sputtering is not employed) by properly using the chambers 32, 34, and 36. Subsequently, a ferromagnetic metal magnetic film 65 shown in FIG. 1 was formed in the fifth chamber 38 and, finally, a protective film 66 made of carbon was formed in the seventh chamber 42 to obtain a magnetic recording medium sample. In the chambers for formation of each film 32, 34, 36, and 38, sputtering was conducted to attain the film forming conditions after filling with an ultra clean gas of Ar in an ultra-high vacuum atmosphere of $3 \times 10^{-9}$ Torr ($400 \times 10^{-9}$ Pa) until the pressure reaches $1 \times 10^{-3}$ Torr ($133 \times 10^{-3}$ Pa) in order to carry out the ultra clean process.

The surface of the glass substrate was cleaned by dry etching in the first chamber 30 and a metallic underlayer made of Cr was formed in the fourth chamber 36, and then a CoCrGe alloy magnetic film was formed I the fifth chamber 38. Using the device shown in FIG. 8, a CoCrGeTaPt alloy magnetic film, a CoCrGeTaPtB alloy magnetic film, a CoCrGePt alloy magnetic film, and a CoCrGeTa alloy magnetic film were formed on plural glass plates under the same conditions to obtain each sample.

After the formation of films, the respective alloy magnetic films were optionally analyzed by using a RHEED (reflection high energy electron diffraction) analyzer in the sixth chamber 40 to determine whether or not the respective alloy magnetic films were securely formed. After a protective film made of carbon was formed in the seventh chamber 42, the magnetic recording medium sample was removed from the chamber 42 by the robot arm 45 and then subjected to a magnetic characteristics measuring test using a vibrating sample magnetometer and a high-sensitivity torque magnetometer.

The composition dependence on the magnetic anisotropy field ($H_k^{grain}$) of a ferromagnetic metal magnetic film with the CoCrGe ternary composition produced by the ultra clean process using the device shown in FIG. 8 is shown in FIG.

Figure 10:
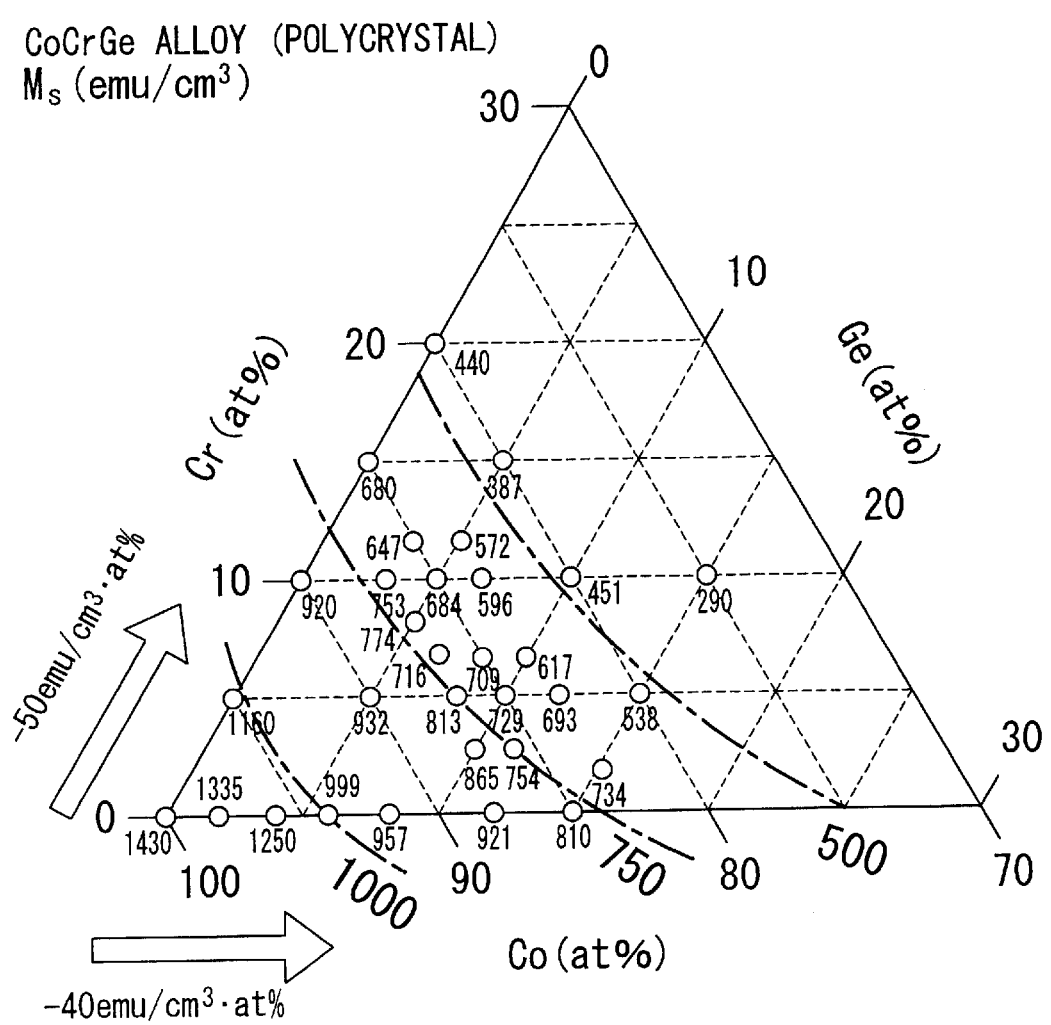
FIG. 10 is a triangular composition diagram showing the concentration dependence of Cr, Co and Ge on the saturation magnetization (Ms) of the samples obtained in the embodiments.
Figure 11:
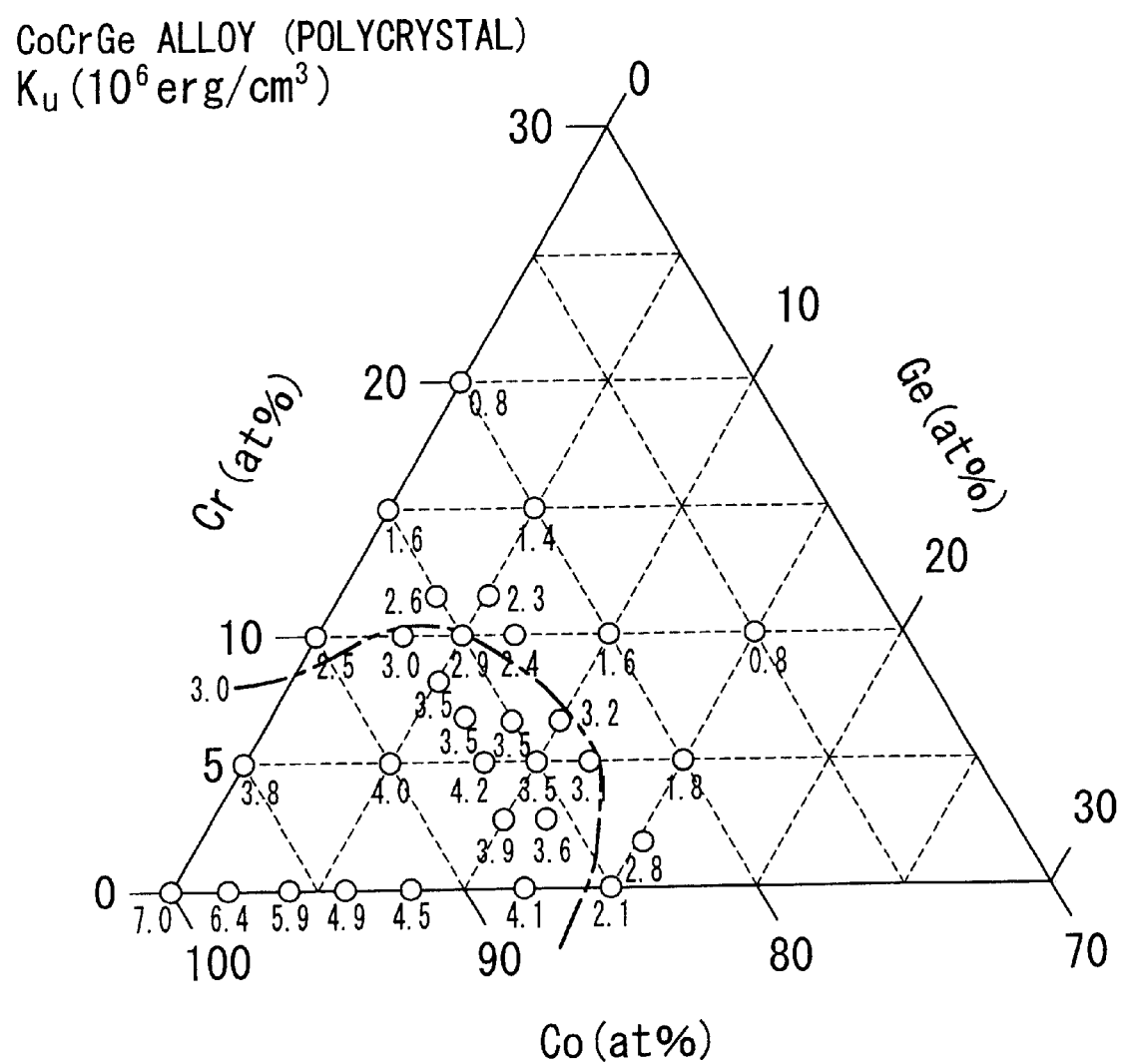
FIG. 11 is a triangular composition diagram showing the concentration dependence of Cr, Co and Ge on the magnetocrystalline anisotropy ($K_u^{grain}$) of the samples obtained in the embodiments.
Figure 12:
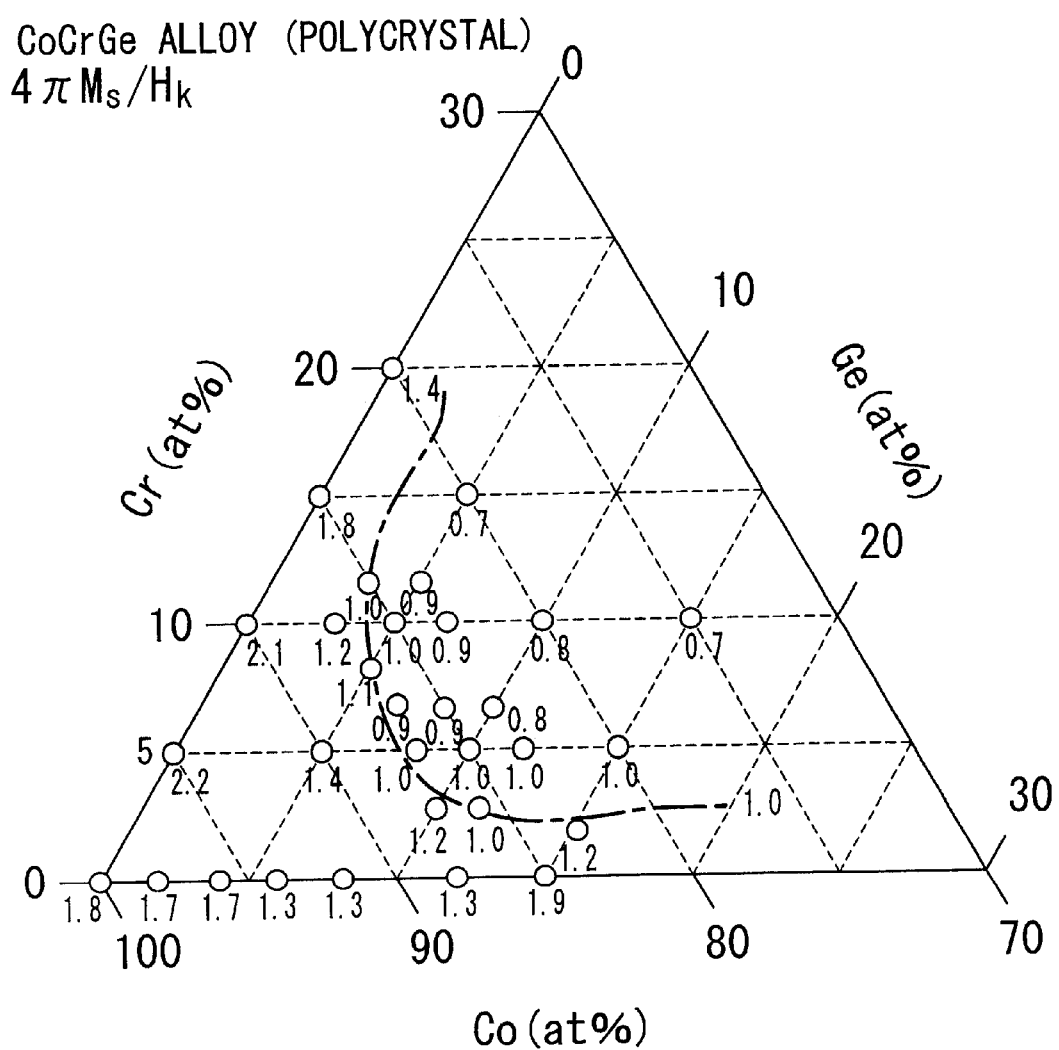
FIG. 12 is a triangular composition diagram showing the concentration dependence of Cr, Co and Ge on ($4\pi Ms/H_k^{grain}$) as the relationship between saturation magnetization (Ms) and magnetic anisotropy field ($H_k^{grain}$) of the samples obtained in the embodiments.

9, the composition dependence on saturation magnetization (Ms) of the same sample is shown in FIG. 10, the composition dependence on magnetocrystalline anisotropy ($K_u^{grain}$) of the same sample is shown in FIG. 11, and the relationship ($4\pi MS/H_k^{grain}$) between saturation magnetization (Ms) and magnetic anisotropy field ($H_k^{grain}$) of the same sample is shown in FIG. 12.

The characteristics obtained in FIG. 9 to FIG. 12 were excellent characteristics which are the same as those of the measurement results shown in FIG. 2 to FIG. 4.

Figure 9:
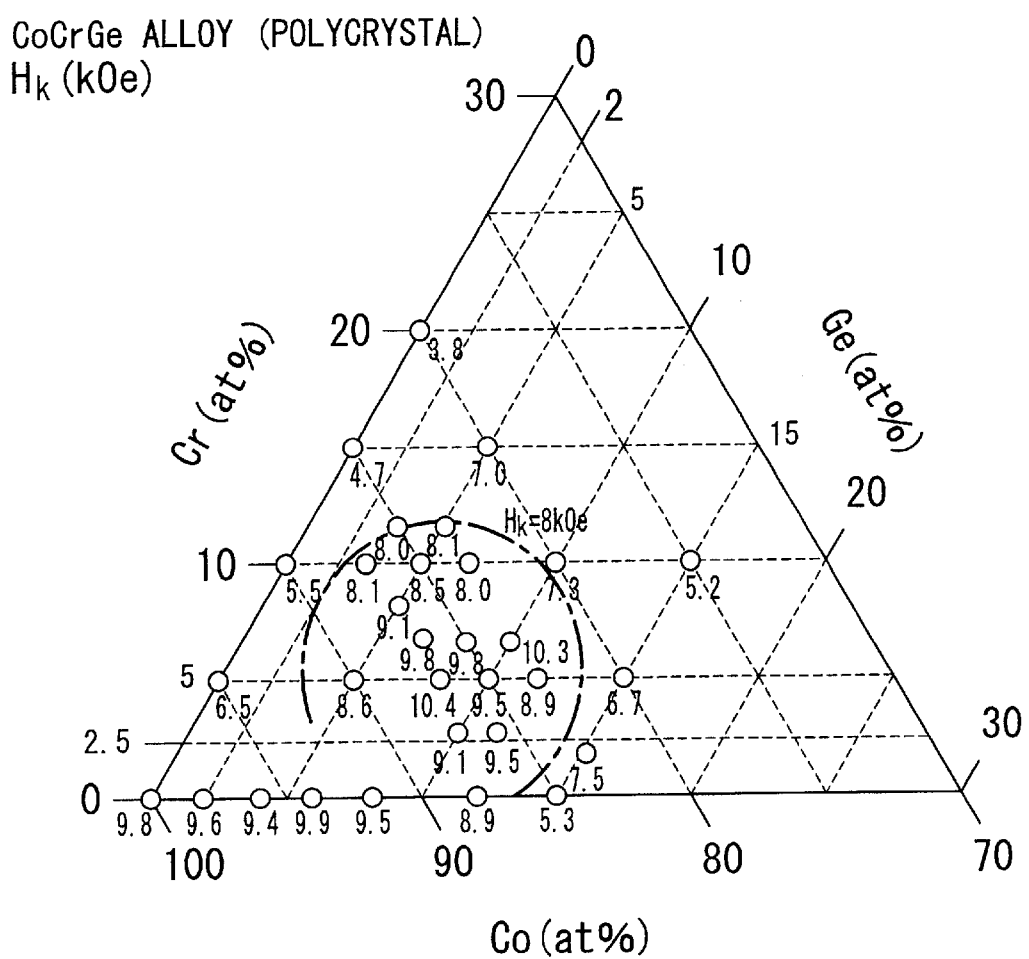
FIG. 9 is a triangular composition diagram showing the concentration dependence of Cr, Co and Ge on the magnetic anisotropy field ($H_k^{grain}$) of the samples obtained in the embodiments.

As is apparent from FIG. 9, high magnetic anisotropy field $H_k^{grain}$ is easily obtained even if the lower limit of the Cr content is controlled to 2.5 atomic % and high magnetic anisotropy field $H_k^{grain}$ is easily obtained even if the lower limit of the Ge content is controlled to 2 atomic % in the magnetic film made of a CoCrGe ternary alloy produced by the ultra clean process.

Figure 13:
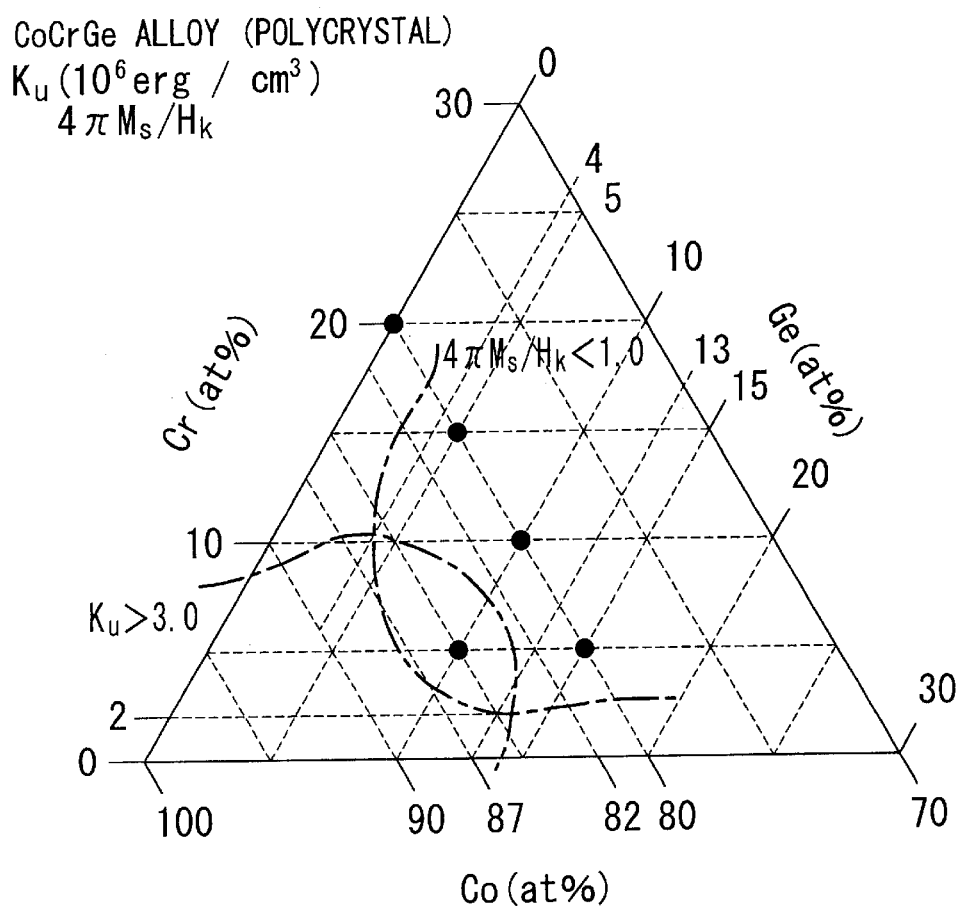
FIG. 13 is a triangular composition diagram showing a composition region where the magnetocrystalline anisotropy ($K_u^{grain}$) of the samples obtained in the embodiments exceeds 3.0 and a composition region where $4\pi Ms/H_k^{grain}$ of the same samples less than 1.0.

A composition region where a value of magnetocrystalline anisotropy ($K_u^{grain}$) shown in FIG. 11 exceeds 3.0 and a composition region where a value of ($4\pi MS/H_k^{grain}$) shown in FIG. 12 is smaller than 1.0 are shown in FIG. 13.

As is apparent from FIG. 13, the composition region enclosed by the oblique line shown in FIG. 13 simultaneously satisfies the relationships: ($K_u^{grain}$)>3.0 and ($4\pi MS/H_k^{grain}$)≦1.0.

In the sample of this embodiment, this region corresponds to the following range: $82 \leq Co \leq 87$, $2 \leq Cr \leq 11$, and $4 \leq Ge \leq 13$ (unit: atomic %).

The composition dependence (corresponding to any one of Pt, Cr, Ta, and B) of the value of coercive force (Hc), the value of magnetocrystalline anisotropy ($K_u^{grain}$) and the value of saturation magnetization (Ms) of a CoCrPtTa ferromagnetic metal magnetic film, a CoCrPtB ferromagnetic metal magnetic film, a CoCrTa ferromagnetic metal magnetic film, a CoCrTaPt ferromagnetic metal magnetic film, and a ferromagnetic metal magnetic film with the composition obtained by adding a predetermined amount of Ge to the alloy, which were produced by the same ultra clean process as that of the above example using the device shown in FIG. 8 are shown in FIG. 8.

Figure 14:
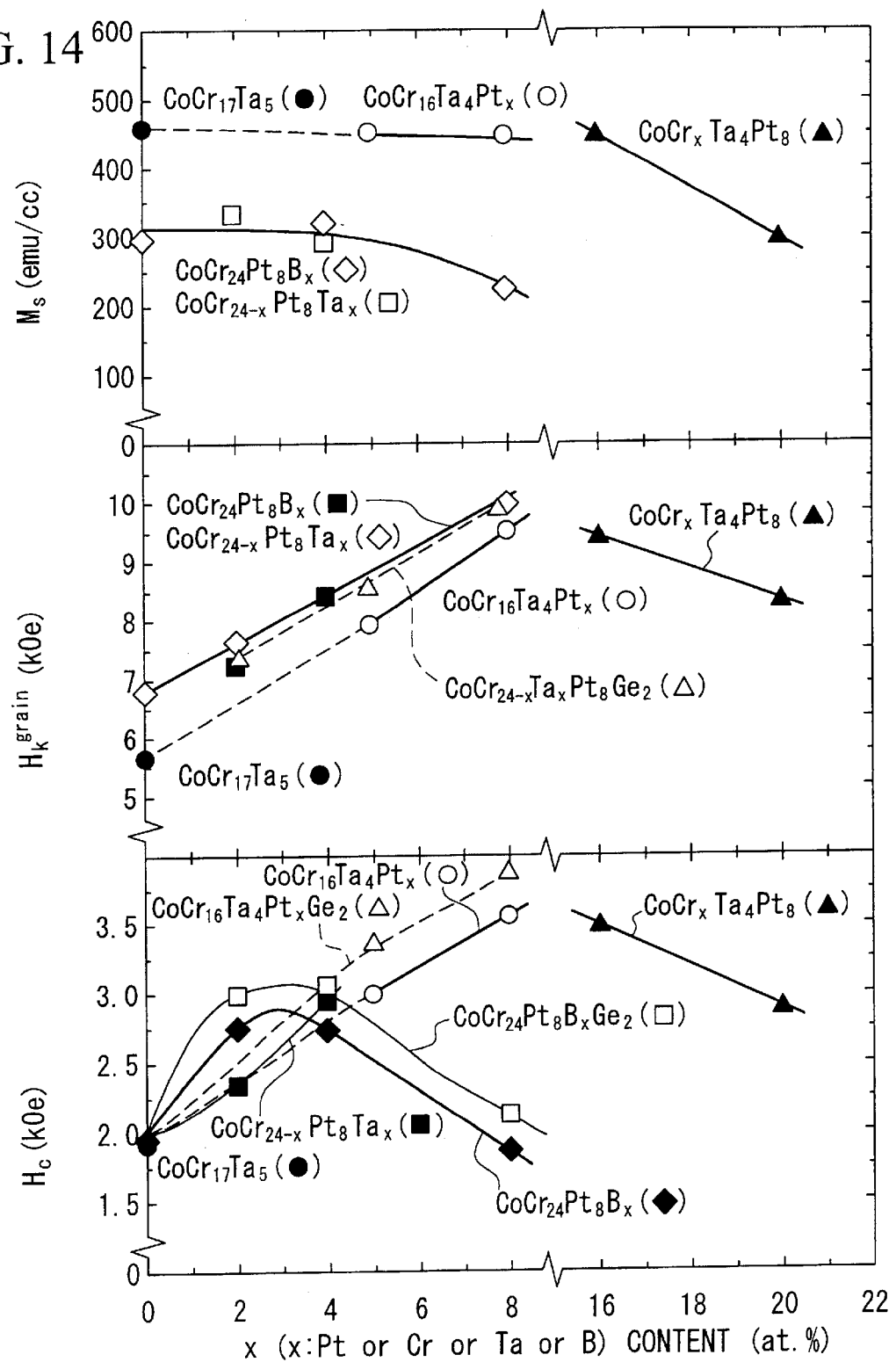
FIG. 14 is a graph showing the composition dependence of the coercive force (Hc), magnetocrystalline anisotropy ($H_k^{grain}$), and saturation magnetization (Ms) of the samples obtained in the embodiments.

As is apparent from the measurement results shown in FIG. 14, the sample obtained by adding 2 atomic % of Ge to a CoCrPtTa alloy exhibited the coercive force (Hc), magnetocrystalline anisotropy ($K_u^{grain}$) and saturation magnetization (Ms), which are the same as or superior to those of the sample made of the CoCrPtTa alloy. The sample obtained by adding 2 atomic % of Ge to a CoCrPtB alloy exhibited a coercive force (Hc), magnetocrystalline anisotropy ($K_u^{grain}$) and saturation magnetization (Ms), which are the same as or superior to those of the sample made of the CoCrPtB alloy.

Figure 15:
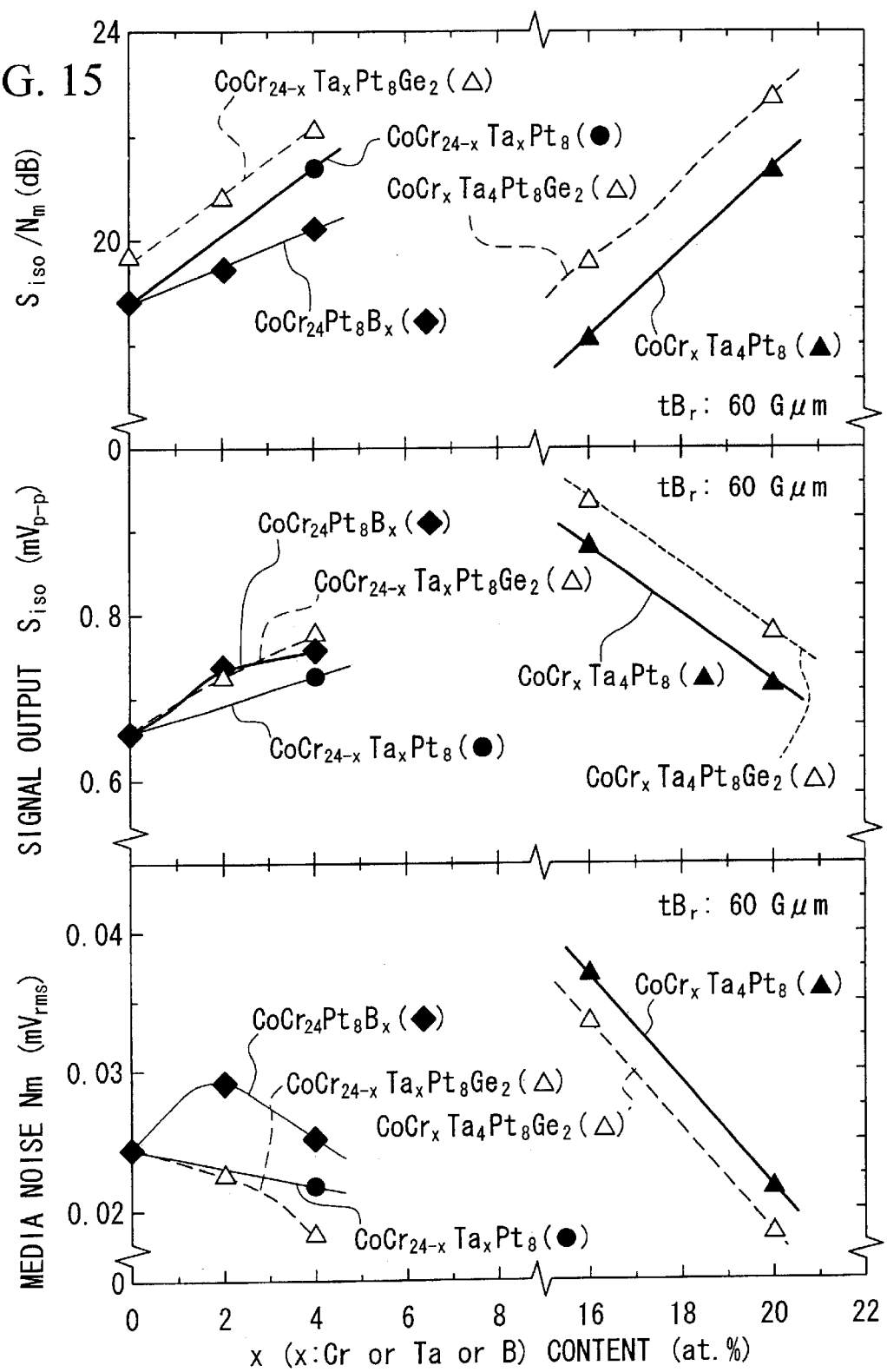
FIG. 15 is a graph showing the composition dependence of the noise, output signal and S/N ratio of the samples obtained in the embodiments.

The medium noise, output signal and S/N ratio of the samples with the above compositions are shown in FIG. 15.

As is apparent from the results shown in FIG. 15, the medium noise and signal output, which are superior to those of the sample made of a CoCrPtB alloy, were obtained and the medium noise and signal output, which are the same as those of the sample made of a CoCrPtTa alloy, were obtained in the sample made of a CoCrTaPtGe alloy. Consequently, a value of the S/N ratio, which is superior to that of the sample made of a CoCrTaPt alloy and a CoCrTaB alloy, could be obtained. As is apparent from the results of the relationship between the medium noise, signal output and S/N ratio shown in FIG. 15, characteristics which are superior to those of a conventional CoCrTaPt alloy, were obtained in a CoCrTaPtGe alloy with the composition of high Cr concentration within a range from 16 to 20 atomic % so that characteristics which are superior to those of an alloy with a conventional composition, are also obtained in an alloy with the composition of a high Cr concentration. Since the relationship between the medium noise, signal output and S/N ratio of a CoCrTaPtGe alloy with the composition of a high Cr concentration is superior to the respective characteristics of a CoCrPtB or CoCrTaPt alloy with the composition of low Cr concentration (the range of Cr within a range from 1 to 8 atomic % corresponds to a composition with low Cr concentration), a Cr content within a range from 16 to 20 atomic % obtained from the knowledge of the measurement results shown in FIG. 15 causes no problem. With regard to the Cr content of the CoCrTaPtGe alloy, it is considered that the CoCrTaPt alloy can contain Cr in an amount up to 24 atomic % which is the upper limit of the amount of Cr to be added.

Figure 16:
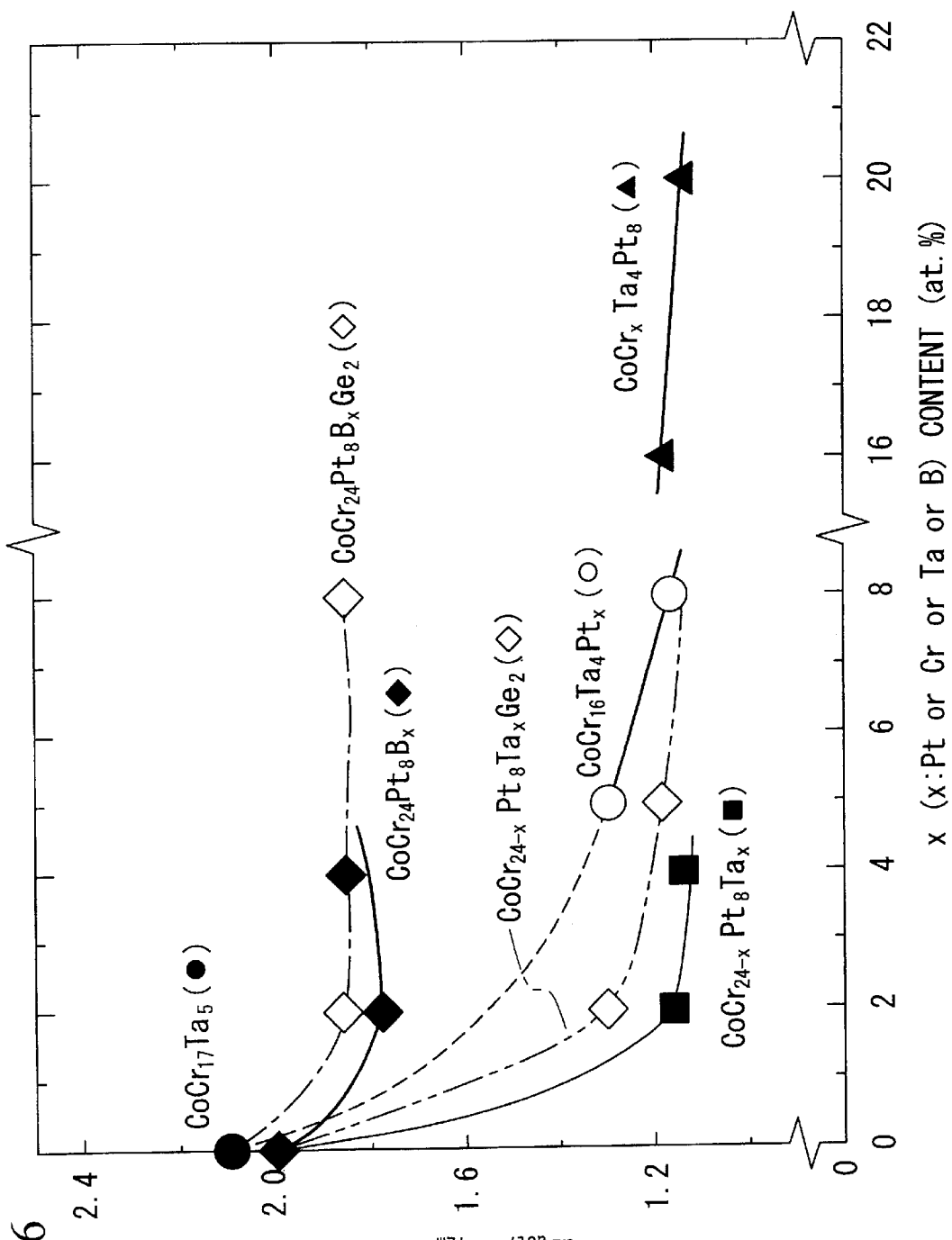
FIG. 16 is a graph showing the results of the ratio of the measurement results of the grain size ($GD_{TEM}$) by means of a transmission type electron microscope (TEM) photograph of a ferromagnetic metal magnetic film of the samples obtained in the embodiments to the grain size ($GD_{act}$) in case of magnetization reversal.

The results of a ratio of the measurement results of the grain size ($GD_{TEM}$) by means of a transmission type electron micriscope (TEM) photograph to the grain size ($GD_{act}$) in the case of magnetization reversal with respect to the above samples for each composition are shown in FIG. 16.

As used herein, the term "size ($GD_{act}$) in case of magnetization reversal" should be an indication of the thermal stability of the magnetic recording medium and is represented by the equation:

$$DG_{act} = 2(V_{act}/\pi t_{mag})^{1/2}$$

where $V_{act}$ has the relationship: $V_{act}=(K_B \cdot T)/(Ms \cdot Hf)$; ($K_B \cdot T$) denotes thermal energy, ($MS \cdot H_f \cdot V_{act}$) denotes the relationship, $H_f$ has the relationship: $H_f=S/Xirr$, and Xirr has the relationship: $Xirr=\Delta M/\Delta H$, which denotes a ratio of $\Delta H$ to $\Delta M$ at about the point of magnetization H when M=0 in a magnetic hysteresis curve of the magnetic film, that is, the portion where the abscissa axis and the magnetic hysteresis curve of the magnetic film intersect.

As is apparent from the relationship shown in FIG. 16, any of a CoCrTa ferromagnetic metal magnetic film, a CoCrTaPt ferromagnetic metal magnetic film, a CoCrPtTa ferromagnetic metal magnetic film, and a ferromagnetic metal magnetic film by adding a predetermined amount of Ge to the ferromagnetic metal exhibits excellent characteristics.

Figure 17:
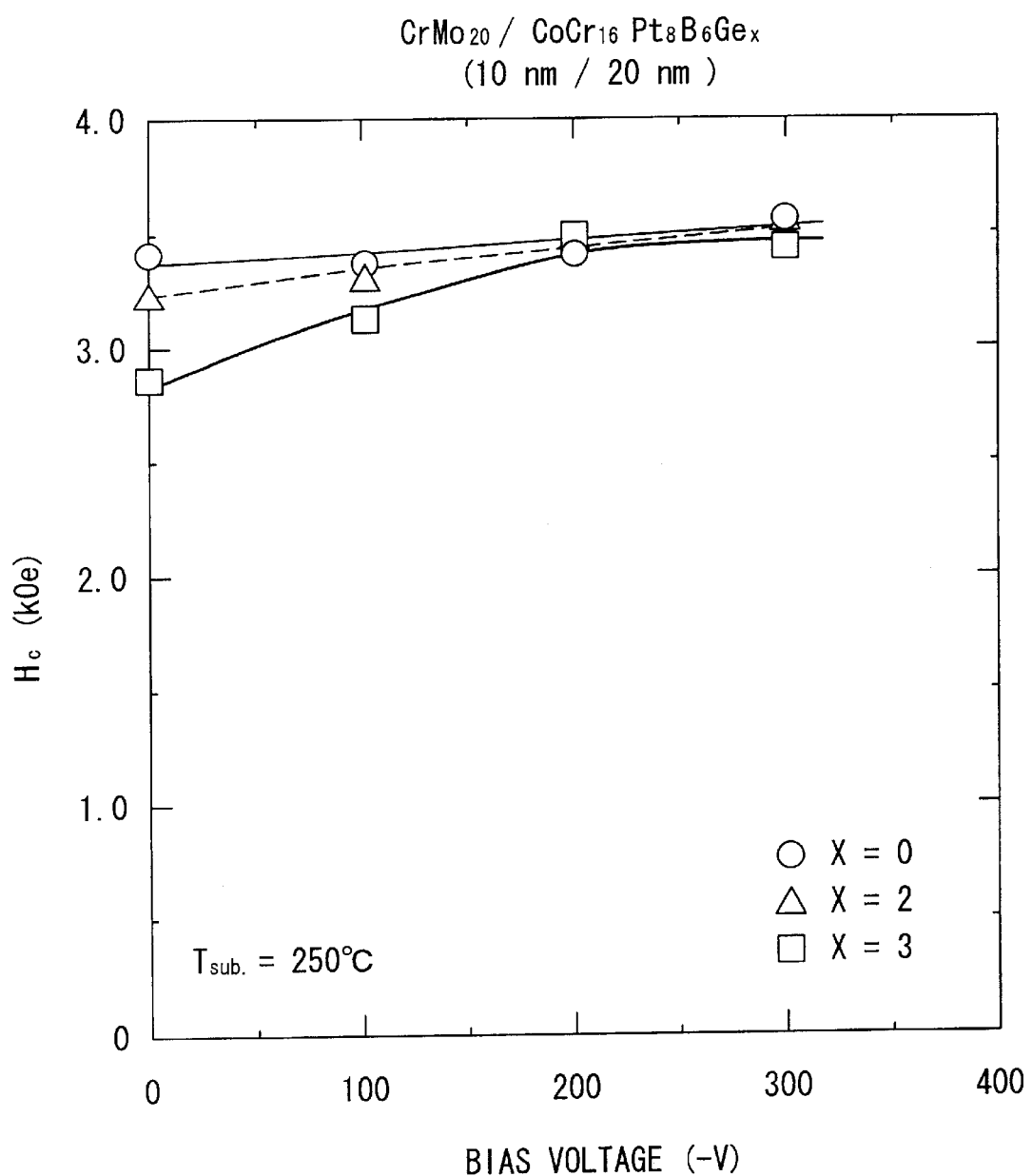
FIG. 17 is a graph showing the bias voltage dependence of the coercive force (Hc) in the samples obtained in the embodiments.

In FIG. 17, the change of the coercive force of each sample in the case of forming a film while applying a bias to a substrate and in the case of forming a film without applying a bias to a substrate when a ferromagnetic metal magnetic film with the composition represented by $CoCr_{16}Pt_8B_6Gex$ (each sample wherein x is 0, 2, or 3) is formed on a $CrMo_{20}$ underlayer (10 mm in thickness) is shown.

As is apparent from the results shown in FIG. 17, the coercive force is scarcely lowered even if a sample is made by adding 2 atomic % of Ge to the CoCrPT ferromagnetic metal magnetic film and the coercive force is lowered in case a film was formed without applying a bias in a sample made by adding 3 atomic % of Ge. Also in this sample, a ferromagnetic metal magnetic film can be produced without lowering the coercive force by applying a proper bias voltage.

Figure 18:
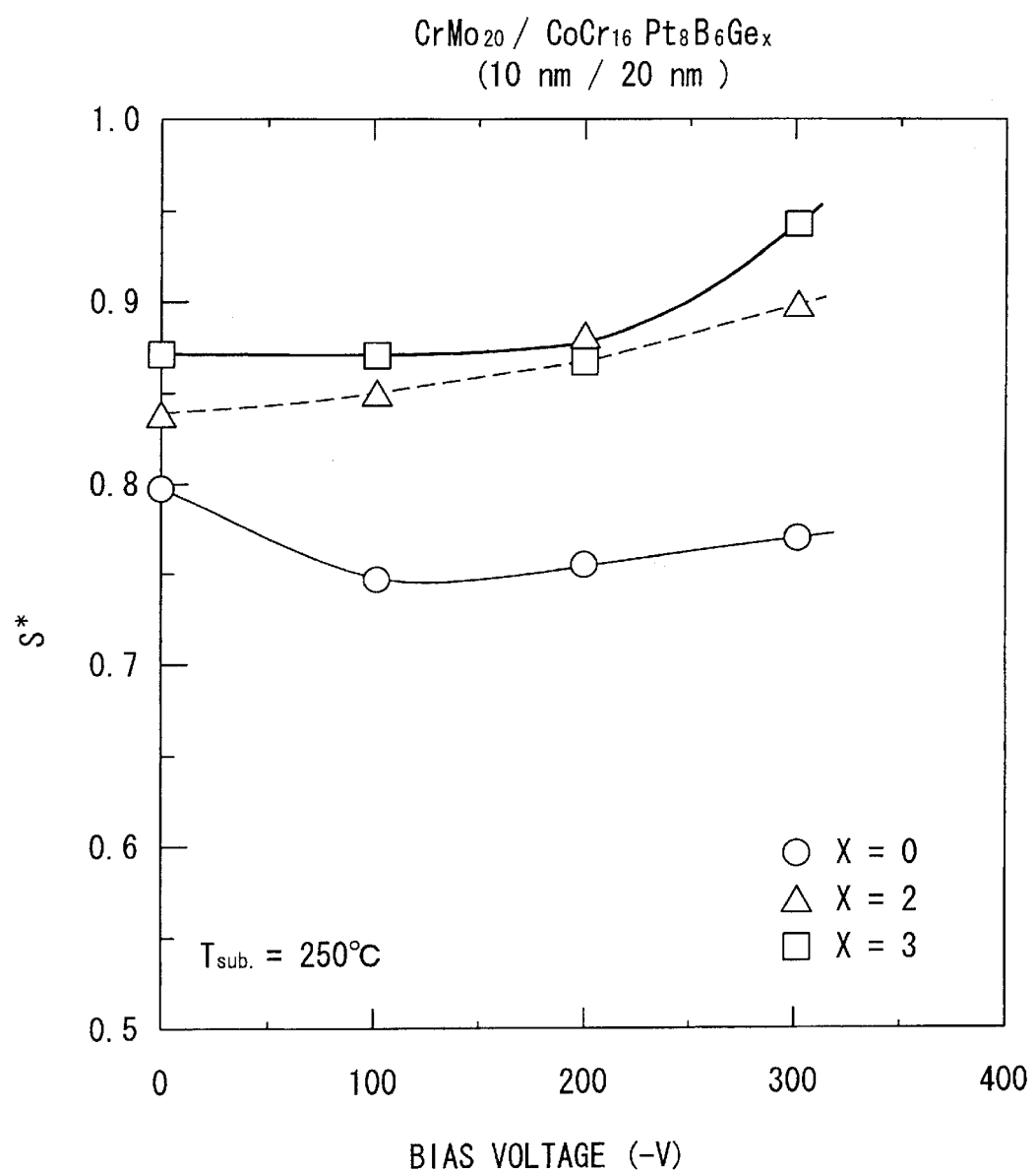
FIG. 18 is a graph showing the bias voltage dependence of coercive force squareness ratio (S*) in the samples obtained in the embodiments.

FIG. 18 shows the bias voltage dependence of coercive force squareness ratio (S*) of the respective ferromagnetic metal magnetic films obtained in case a film is formed by applying a bias to the substrate.

As is apparent from the results shown in FIG. 18, the coercive force squareness ratio S* of the CoCrPtBGe ferromagnetic metal magnetic film obtained by adding 2 or 3 atomic % of Ge is higher than the coercive force squareness ratio (S*) of the CoCrPtB ferromagnetic metal magnetic film without adding Ge and the addition effect of Ge are remarkable.

Next, an alloy sample was made under the same conditions as those in the case of making the above CoCrGe ternary alloy sample and then subjected to the test of magnetic characteristics. As a result, almost the same test results as those obtained in the above ferromagnetic metal magnetic film could be obtained.

As is apparent from the above descriptions, the alloy or ferromagnetic metal layer with the composition according to the present invention has excellent magnetic characteristics.

Among the above addition elements, Pt is capable of attaining a high value of the coercive force while enhancing a value of the magnetic anisotropy field ($H_k^{grain}$) without a reduction of the other characteristics. Therefore, the amount can be appropriately selected from a wide range of 2 to 25 atomic %. Higher content of Cr tends to decrease the medium noise (Nm). B contributes to grain refinement and a large amount of B tends to reduce the grain size, while too large an amount of B tends to lower the coercive force due to random crystalline orientation. For the reasons described above, it is preferable to satisfy the composition ratio of the present invention.

INDUSTRIAL APPLICABILITY

As described above, according to the present invention, it is possible to obtain a magnetic alloy, which has magnetic characteristics capable of corresponding increases in the recording density, i.e. which has a high normalized coercive force and magnetocrystalline anisotropy, and also has a more excellent magnetic anisotropy field, by using a ternary CoCrGe alloy, CoCrGeT alloy or CoCrGeT' alloy with above specific composition, ternary CoCrGe alloy, CoCrGeT alloy or CoCrGeT' alloy with the composition within the above specific range.

As described above, according to the present invention, it is possible to obtain a magnetic recording medium, which has magnetic characteristics capable of corresponding an increase of the recording density, i.e. which has a high normalized coercive force and magnetocrystalline anisotropy, by using a ternary CoCrGe alloy, CoCrGeT alloy or CoCrGeT' alloy with the composition within the above specific range even in the case of using a conventional film forming process utilizing a film forming space wherein an ultimate vacuum degree is in the order of $10^{-6}$ Torr.

The magnetic recording medium comprising a magnetic film made of a ternary CoCrGe alloy magnetic film with the above specific ratio, or a magnetic film made of a CoCrGeT or CoCrGeT' alloy with the above specific composition can form a film in a non-bias state without applying a bias to the substrate so that an insulating glass having excellent evenness can be employed as the substrate. Also it is made possible to produce a magnetic recording medium while avoiding defects in the production due to application of a bias to the substrate.

A target containing Co, Cr and Ge in the above specific composition ratio, or a target containing Co, Cr, Ge, and an element T or T' makes it possible to produce a magnetic recording medium which has magnetic characteristics capable of corresponding increased recording density, i.e. both high normalized coercive force and a high magnetocrystalline anisotropy, even in case of using a conventional film forming process utilizing a film forming space wherein an ultimate vacuum degree is in the order of $10^{-6}$ Torr.

A magnetic recording device comprising a magnetic recording medium with the above ferromagnetic metal magnetic film having excellent magnetic characteristics can provide a magnetic recording device, which does not undergo deterioration of magnetic characteristics even when used in a heated state for a long time, because the ferromagnetic metal magnetic film has a high resistance to thermal agitation. A magnetic recording device comprising a magnetic recording medium with the above ferromagnetic metal magnetic film having excellent magnetic characteristics can provide a magnetic recording device having excellent magnetic recording/reproduction characterstics with a high SN ratio.

What is claimed is:

1. A magnetic alloy consisting essentially of cobalt (Co), chromium (Cr), germanium (Ge), platinum (Pt), and an element T' (T' represents one or more of the elements Ta and B), a composition of said magnetic alloy being represented by the general formula:

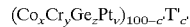

$(Co_xCr_yGe_zPt_v)_{100-c'}T'_{c'}$ where x, y, z, v, and c', which represent a composition ratio in terms of atomic %, satisfy the relationships: $45 \leq x \leq 87$, $2.5 \leq y \leq 25$, $2 \leq z \leq 15$, $2 \leq v \leq 25$, and $1 \leq c' \leq 12$.

2. A magnetic alloy according to claim 1, wherein c', which represents a composition ratio of T', is 1 atomic % or more and 8 atomic % or less when said T' is B'.

3. A magnetic alloy according to claim 1, wherein c', which represents a composition ratio of T', is 1 atomic % or more and 8 atomic % or less when said T' is Ta.

4. A magnetic recording medium comprising a substrate and a ferromagnetic metal magnetic film formed on said substrate via a metallic underlayer, said ferromagnetic metal magnetic film being a magnetic film consisting essentially of cobalt (Co), chromium (Cr), germanium (Ge), platinum (Pt), and an element T' (T' represents one or more elements of Ta and B), a composition of said magnetic alloy being represented by the general formula:

$(Co_xCr_yGe_zPt_v)_{100-c'}T'_{c'}$ where x, y, z, v, and c', which represent a composition ratio in terms of atomic %, satisfy the relationships: $45 \leq x \leq 87$, $2.5 \leq y \leq 25$, $2 \leq z \leq 15$, $2 \leq v \leq 25$, and $1 \leq c' \leq 12$.

5. A magnetic recording medium according to claim 4, wherein c', which represents a composition ratio of B, is 1 atomic % or more and 8 atomic % or less when said T' is B.

6. A magnetic recording medium according to claim 5, wherein c', which represents a composition ratio of Ta, is 1 atomic % or more and 8 atomic % or less when said T' is Ta.

7. A target for forming a magnetic film, consisting essentially of cobalt (Co), chromium (Cr), germanium (Ge), and an element T' (T' represents one or more elements of Ta and B), a composition of said target being represented by the general formula:

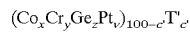

$(Co_xCr_yGe_zPt_v)_{100-c'}T'_{c'}$ where x, y, z, v, and c', which represent a composition ratio in terms of atomic %, satisfy the relationships: $45 \leq x \leq 87$, $2.5 \leq y \leq 25$, $2 \leq z \leq 15$, $2 \leq v \leq 25$, and $1 \leq c' \leq 12$.

8. A target for forming a magnetic film according to claim 7, wherein said composition ratio satisfies the relationships: $73 \leq x \leq 87$, $2.5 \leq y \leq 13$, and $2.5 \leq z \leq 14$.

9. A target for forming a magnetic film according to claim 7, wherein c', which represents a composition ratio of B, is 1 atomic % or more and 8 atomic % or less when said T' is B.

10. A target for forming a magnetic film according to claim 7, wherein c', which represents a composition ratio of T', is 1 atomic % or more and 8 atomic % or less when said T' is Ta.

11. A magnetic alloy consisting essentially of cobalt (Co), chromium (Cr), germanium (Ge), platinum (Pt), and an element T' (T' represents one or more of the elements Ta and B), a composition of said magnetic alloy being represented by the general formula:

$$(Co_xCr_yGe_zPt_v)_{100-c'}T'_{c'}$$

where x, y, z, v, and c', which represent a composition ratio in terms of atomic %, satisfy the relationships: $45 \leq x \leq 87$, $2.5 \leq y \leq 14.5$, $3.5 \leq z \leq 15$, $2 \leq v \leq 25$, and $1 \leq c' \leq 12$.

12. A magnetic alloy according to claim 11, wherein c', which represents a composition ratio of T', is 1 atomic % or more and 8 atomic % or less when said T' is B.

13. A magnetic alloy according to claim 11, wherein c', which represents a composition ratio of T', is 1 atomic % or more and 8 atomic % or less when said T' is Ta.

14. A magnetic recording medium comprising a substrate and a ferromagnetic metal magnetic film formed on said substrate via a metallic underlayer, said ferromagnetic metal magnetic film being a magnetic film consisting essentially of cobalt (Co), chromium (Cr), germanium (Ge), platinum (Pt), and an element T' (T' represents one or more elements of Ta and B), a composition of said magnetic alloy being represented by the general formula:

$$(Co_xCr_yGe_zPt_v)_{100-c'}T'_{c'}$$

where x, y, z, v, and c', which represent a composition ratio in terms of atomic %, satisfy the relationships: $45 \leq x \leq 87$, $2.5 \leq y \leq 14.5$, $3.5 \leq z \leq 15$, $2 \leq v \leq 25$, and $1 \leq c' \leq 12$.

15. A magnetic recording medium according to claim 14, wherein c', which represents a composition ratio of B, is 1 atomic % or more and 8 atomic % or less when said T' is B.

16. A magnetic recording medium according to claim 15, wherein c', which represents a composition ratio of Ta, is 1 atomic % or more and 8 atomic % or less when said T' is Ta.

17. A target for forming a magnetic film, consisting essentially of cobalt (Co), chromium (Cr), germanium (Ge), and an element T' (T' represents one or more elements of Ta and B), a composition of said target being represented by the general formula:

$$(Co_xCr_yGe_zPt_v)_{100-c'}T'_{c'}$$

where x, y, z, v, and c', which represent a composition ratio in terms of atomic %, satisfy the relationships: $45 \leq x \leq 87$, $2.5 \leq y \leq 14.5$, $3.5 \leq z \leq 15$, $2 \leq v \leq 25$, and $1 \leq c' \leq 12$.

18. A target for forming a magnetic film according to claim 17, wherein said composition ratio satisfies the relationships: $73 \leq x \leq 87$, $2.5 \leq y \leq 13$, and $3.5 \leq z \leq 14$.

19. A target for forming a magnetic film according to claim 17, wherein c', which represents a composition ratio of B, is 1 atomic % or more and 8 atomic % or less when said T' is B.

20. A target for forming a magnetic film according to claim 17, wherein c', which represents a composition ratio of T', is 1 atomic % or more and 8 atomic % or less when said T' is Ta.

* * * * *